(12) United States Patent
Chang et al.

(10) Patent No.: US 12,313,687 B1
(45) Date of Patent: May 27, 2025

(54) METHOD OF DETECTING METAL PLATING IN INTERCALATION CELLS

(71) Applicant: Qnovo Inc., Milpitas, CA (US)

(72) Inventors: On K. Chang, San Jose, CA (US); Dania Ghantous, Walnut Creek, CA (US)

(73) Assignee: Qnovo Inc., Milpitas, CA (US)

( * ) Notice: Subject to any disclaimer, the term of this patent is extended or adjusted under 35 U.S.C. 154(b) by 0 days.

(21) Appl. No.: 18/494,288

(22) Filed: Oct. 25, 2023

Related U.S. Application Data

(60) Division of application No. 17/644,116, filed on Dec. 14, 2021, now Pat. No. 11,940,500, which is a
(Continued)

(51) Int. Cl.
| | |
|---|---|
| *G01R 31/382* | (2019.01) |
| *B60L 58/12* | (2019.01) |
| *G01R 31/388* | (2019.01) |
| *G01R 31/392* | (2019.01) |
| *H01M 10/44* | (2006.01) |

(Continued)

(52) U.S. Cl.
CPC ........... *G01R 31/382* (2019.01); *B60L 58/12* (2019.02); *G01R 31/388* (2019.01); *G01R 31/392* (2019.01); *H01M 10/44* (2013.01); *H01M 10/48* (2013.01); *H02J 7/00711* (2020.01); *H02J 7/0047* (2013.01); *H02J 7/0048* (2020.01)

(58) Field of Classification Search
CPC .. G01R 31/382; G01R 31/388; G01R 31/392; B60L 58/12; H01M 10/44; H01M 10/48; H02J 7/00711; H02J 7/0047; H02J 7/0048

USPC ........................................................ 320/139
See application file for complete search history.

(56) References Cited

U.S. PATENT DOCUMENTS

| | | | |
|---|---|---|---|
| 5,108,696 | A | 4/1992 | Heck |
| 6,076,018 | A | 6/2000 | Sturman et al. |

(Continued)

FOREIGN PATENT DOCUMENTS

| | | |
|---|---|---|
| CN | 102906961 B | 1/2016 |
| CN | 103683385 B | 7/2017 |

(Continued)

OTHER PUBLICATIONS

In situ detection of lithium metal plating on graphite in experimental cells CrossMark C. Uhlmann a,*, J. Illig a, M. Ender a, R. Schuster b, E. Ivers-Tiffee, Journal of Power Sources 279 (2015) p. 428-438 (Year: 2015).*

(Continued)

*Primary Examiner* — M Baye Diao
(74) *Attorney, Agent, or Firm* — Weaver Austin Villeneuve & Sampson LLP

(57) ABSTRACT

In one aspect, non-invasive methods are described in which combinations of certain battery parameter values are used to identify whether metal plating (e.g., lithium plating) has occurred during charging of a battery. In response to the detection of metal plating and/or conditions associated with metal plating, one or more characteristics of a charge process may be adjusted or adapted to maintain battery parameter values within a specified range. In some cases, after detection of metal plating, a battery charge process may be adjusted or adapted to remove metal plating from a battery's anode by a discharge pulse.

16 Claims, 15 Drawing Sheets

Related U.S. Application Data continuation of application No. 15/678,030, filed on Aug. 15, 2017, now Pat. No. 11,237,216.

(51) Int. Cl.
*H01M 10/48* (2006.01)
*H02J 7/00* (2006.01)

(56) References Cited

U.S. PATENT DOCUMENTS

| | | |
|---|---|---|
| 6,695,961 B1 | 2/2004 | Hubel |
| 6,884,546 B1 | 4/2005 | Fujita et al. |
| 7,622,929 B2 | 11/2009 | Tinnemeyer et al. |
| 7,671,568 B2 | 3/2010 | Martinet et al. |
| 7,854,828 B2 | 12/2010 | Reid et al. |
| 8,008,893 B2 | 8/2011 | Stanley |
| 8,446,127 B2 | 5/2013 | Yazami et al. |
| 8,638,070 B2 | 1/2014 | Maluf et al. |
| 8,889,307 B2 | 11/2014 | Lundblad et al. |
| 8,901,885 B2 | 12/2014 | Kelty et al. |
| 8,906,556 B2 | 12/2014 | Hambitzer |
| 8,970,178 B2 | 3/2015 | Berkowitz et al. |
| 8,975,874 B2 | 3/2015 | Berkowitz et al. |
| 9,035,623 B1 | 5/2015 | Berkowitz et al. |
| 9,061,787 B2 | 6/2015 | Hirano et al. |
| 9,373,972 B2 | 6/2016 | Ghantous et al. |
| 9,385,555 B2 | 7/2016 | Ghantous et al. |
| 9,453,884 B2 | 9/2016 | Patin et al. |
| 9,660,299 B2 | 5/2017 | Xu et al. |
| 9,702,940 B2 | 7/2017 | Maluf et al. |
| 9,742,211 B2 | 8/2017 | Stevens et al. |
| 9,791,513 B2 | 10/2017 | Maluf et al. |
| 10,071,648 B1 | 9/2018 | K |
| 10,120,035 B2 | 11/2018 | Steiber et al. |
| 10,126,367 B2 | 11/2018 | Lee et al. |
| 10,193,198 B2 | 1/2019 | Ishibashi |
| 10,389,156 B2 | 8/2019 | Berkowitz et al. |
| 10,447,054 B2 | 10/2019 | Christensen et al. |
| 10,447,055 B1 | 10/2019 | Berkowitz et al. |
| 10,481,623 B1 | 11/2019 | Forouzan et al. |
| 10,497,980 B2 | 12/2019 | Kawai et al. |
| 10,564,222 B2 | 2/2020 | Pajovic et al. |
| 10,574,079 B1 | 2/2020 | Berkowitz et al. |
| 10,700,376 B2 | 6/2020 | Koch |
| 11,063,459 B2 | 7/2021 | Berkowitz et al. |
| 11,237,216 B1 | 2/2022 | Chang et al. |
| 11,397,215 B2 | 7/2022 | Ghantous et al. |
| 11,397,216 B2 | 7/2022 | Ghantous et al. |
| 11,411,421 B2 | 8/2022 | Komiyama et al. |
| 11,527,786 B1 | 12/2022 | Budan et al. |
| 11,569,678 B2 | 1/2023 | Kang et al. |
| 11,940,500 B1 | 3/2024 | Chang et al. |
| 2001/0009371 A1 | 7/2001 | Podrazhansky et al. |
| 2007/0182418 A1 | 8/2007 | Reynier et al. |
| 2010/0072951 A1 | 3/2010 | Nakashima |
| 2011/0236751 A1 | 9/2011 | Amiruddin et al. |
| 2012/0200266 A1* | 8/2012 | Berkowitz ............ H01M 10/44 320/139 |
| 2013/0119921 A1 | 5/2013 | Choe et al. |
| 2014/0021959 A1 | 1/2014 | Maluf et al. |
| 2014/0065453 A1 | 3/2014 | Schaefer et al. |
| 2015/0377976 A1 | 12/2015 | Maluf et al. |
| 2016/0043447 A1 | 2/2016 | Peh et al. |
| 2016/0116548 A1 | 4/2016 | Ghantous et al. |
| 2016/0146895 A1 | 5/2016 | Yazami |
| 2017/0070061 A1 | 3/2017 | Barsukov et al. |
| 2017/0190262 A1 | 7/2017 | Jin et al. |
| 2017/0203654 A1 | 7/2017 | He et al. |
| 2017/0203660 A1 | 7/2017 | He et al. |
| 2017/0203667 A1 | 7/2017 | He et al. |
| 2017/0214265 A1 | 7/2017 | Stevens et al. |
| 2017/0234930 A1 | 8/2017 | Lee et al. |
| 2017/0279171 A1 | 9/2017 | Ishibashi |
| 2017/0352920 A1 | 12/2017 | Kawai et al. |
| 2018/0053972 A1 | 2/2018 | Kirk et al. |
| 2018/0316195 A1 | 11/2018 | Verbrugge et al. |
| 2019/0031035 A1 | 1/2019 | Koch |
| 2019/0061534 A1 | 2/2019 | Iwashita et al. |
| 2019/0123389 A1 | 4/2019 | Nakagaki et al. |
| 2019/0152341 A1 | 5/2019 | Jin et al. |
| 2019/0229378 A1 | 7/2019 | Zhang et al. |
| 2019/0359066 A1 | 11/2019 | Duan et al. |
| 2019/0379090 A1 | 12/2019 | Verbrugge et al. |
| 2020/0014218 A1 | 1/2020 | Maluf et al. |
| 2020/0136173 A1 | 4/2020 | Hong et al. |
| 2020/0164763 A1 | 5/2020 | Holme |
| 2020/0412153 A1 | 12/2020 | Matsumura et al. |
| 2021/0066945 A1 | 3/2021 | Jung et al. |
| 2021/0066947 A1 | 3/2021 | Du |
| 2021/0159557 A1 | 5/2021 | Knudson |
| 2021/0328448 A1 | 10/2021 | Konopka et al. |
| 2021/0367442 A1 | 11/2021 | Konopka et al. |
| 2022/0187385 A1 | 6/2022 | Laurent et al. |
| 2023/0006271 A1 | 1/2023 | Ghantous et al. |
| 2024/0094300 A1 | 3/2024 | Chang et al. |
| 2024/0094302 A1 | 3/2024 | Chang et al. |
| 2024/0385256 A1 | 11/2024 | Chang et al. |

FOREIGN PATENT DOCUMENTS

| | | | |
|---|---|---|---|
| EP | 3709039 A1 | 9/2020 | |
| EP | 3766120 B1 | 11/2021 | |
| JP | 2004303591 A | 10/2004 | |
| JP | 2009244088 A | 10/2009 | |
| JP | 2013196820 A * | 9/2013 | ............ Y02E 60/10 |
| JP | 5470829 B2 | 4/2014 | |
| JP | 2016061562 A | 4/2016 | |
| JP | 2016119258 A | 6/2016 | |
| JP | 2016194998 A | 11/2016 | |
| KR | 101802000 B1 | 11/2017 | |
| KR | 102118218 B1 | 6/2020 | |
| WO | WO-2006097586 A1 | 9/2006 | |
| WO | WO-2015033666 A1 | 3/2015 | |
| WO | WO-2017006319 A1 | 1/2017 | |

OTHER PUBLICATIONS

Machine Translation (JP2013196820A to Iwase Kosuke) (Year: 2013).*
C. Sinkaram, K. Rajakumar and V. Asirvadam, "Modeling battery management system using the lithium-ion battery," 2012 IEEE International Conference on Control System, Computing and Engineering, Penang, Malaysia, 2012, pp. 50-55 (Year: 2012).*
Ecker, M., et al. "Modeling of lithium plating in lithium-ion batteries," in Meeting Abstracts, Abstract #201, 218th ECS Meeting, The Electrochemical Society, 2010 (1 page).
Harris, S.J., "Lithium Battery Research: Plating," Webpage created Mar. 7, 2010 per Wayback Machine and most recently updated on Oct. 28, 2016 (2 pages). URL: http://lithiumbatteryresearch.com/Piating.php.
Hein, S., et al. "Lithium plating and stripping in the framework of a 3D electrochemical model," ECS Transactions, val. 69, No. 1, Sep. 9, 2015, pp. 3-5. doi:10.1149/06901.0003.
Ratnakumar, B.V., et al. "Lithium plating behavior in lithium-ion cells," ECS Transactions, vol. 25, No. 36, 2010, pp. 241-252. 001:10.1149/1.3393860.
Smart, M.C., et al. "Safe charge rates for lithium-ion cells: Effects of lithium plating," NESC-Battery Working Group Review-NASA Battery Workshop, Huntsville, Alabama, Electrochemical Technologies Group, Nov. 27-29, 2007 (39 pages).
Technische Universitaet Muenchen, "Lithium-ion batteries: Phenomenon of /lithium plating during the charging process observed," ScienceDaily, Sep. 3, 2014, (4 pages). URL: http://www.sciencedaily.com/releases/2014/09/140903105638.htm.
U.S. Restriction Requirement dated Nov. 22, 2022 in U.S. Appl. No. 17/644,116.
U.S. Final Office Action dated Aug. 22, 2023, in U.S. Appl. No. 17/644,116.
U.S. Non-Final office Action dated Dec. 28, 2022 in U.S. Appl. No. 17/644,116.

(56) References Cited

OTHER PUBLICATIONS

U.S. Non-Final Office Action dated May 19, 2023 in U.S. Appl. No. 17/644,116.
US Notice of Allowance dated Jun. 16, 2020 issued in U.S. Appl. No. 15/678,030.
US Notice of Allowance dated Jun. 16, 2021 issued in U.S. Appl. No. 15/678,030.
U.S. Notice of Allowance dated Nov. 21, 2023 in U.S. Appl. No. 17/644,116.
US Notice of Allowance dated Sep. 15, 2021 issued in U.S. Appl. No. 15/678,030.
US Office Action dated Feb. 11, 2021 issued in U.S. Appl. No. 15/678,030.
US Office Action dated Jan. 22, 2020 issued in U.S. Appl. No. 15/678,030.
US Office Action dated Oct. 14, 2020 issued in U.S. Appl. No. 15/678,030.
U.S. Appl. No. 17/644,116, inventors Chang et al., filed Dec. 14, 2021.
U.S. Appl. No. 18/060,834, inventors Maluf et al., filed Dec. 1, 2022.
U.S. Appl. No. 18/368,924, inventors Chang O K, et al., filed Sep. 15, 2023.
Zimmerman, A. H., et al. "Lithium plating in lithium-ion cells," presented at the NASA Battery Workshop, Huntsville, Alabama, Nov. 16-18, 2010 (19 pages).
EP Extended European Search report dated Feb. 26, 2024 in EP Application No. 23197002.1.
Extended European Search Report dated Nov. 6, 2024, (Applicant first notified on Nov. 4, 2024) for Application No. 24175966.1.
Lombardo, T., et al., "Artificial Intelligence Applied to Battery Research: Hype or Reality?," Chemical Reviews, 2022, vol. 122(12), pp. 10899-10969.
U.S. Non-Final Office Action dated Sep. 24, 2024 in U.S. Appl. No. 18/443,538.
U.S. Appl. No. 18/443,538, inventors Chang O.K, et al., filed Feb. 16, 2024.

\* cited by examiner

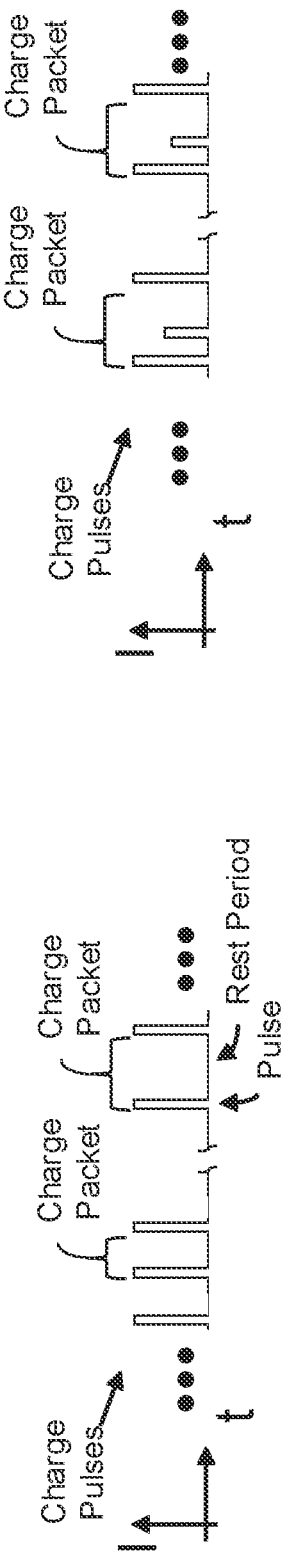
FIGURE 4a
FIGURE 4b
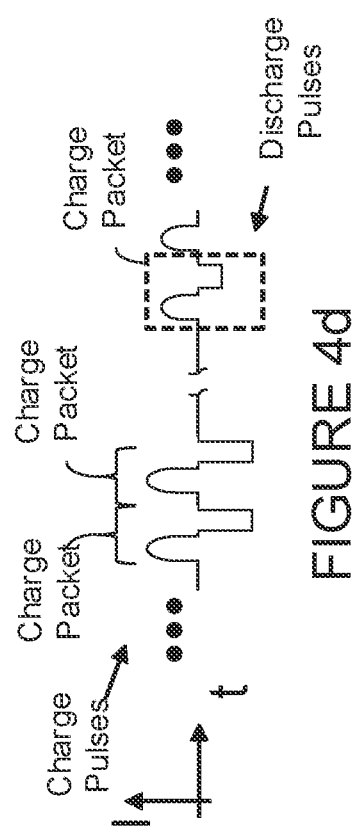
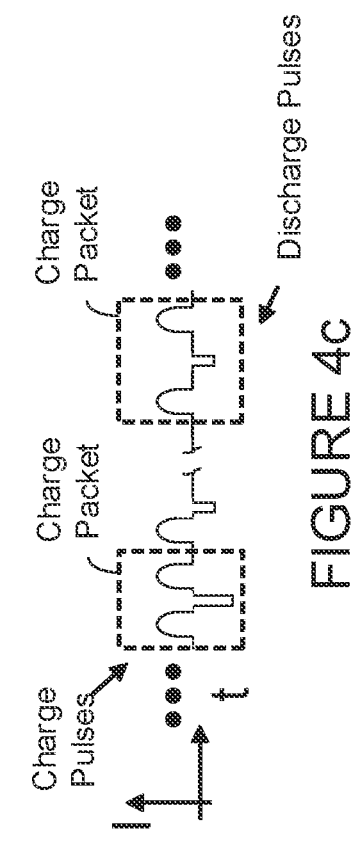
FIGURE 4c
FIGURE 4d
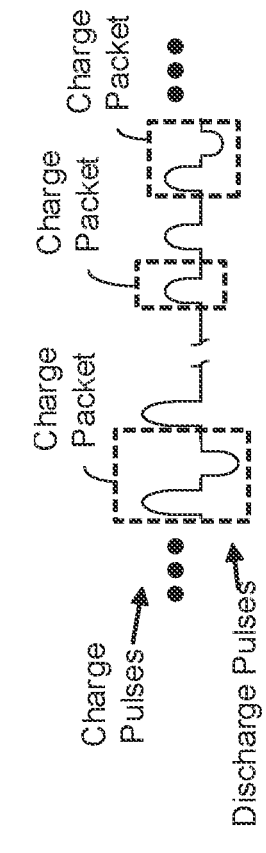
FIGURE 4e

METHOD OF DETECTING METAL PLATING IN INTERCALATION CELLS

CROSS-REFERENCES TO RELATED APPLICATIONS

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

By design, lithium ions are incorporated into the active anode material of a lithium ion battery during the charge phase of a battery cycle and withdrawn from the material during the discharge phase. Frequently, the active anode material can incorporate a relatively large amount of lithium per unit volume or weight. Examples of such materials include silicon and carbonaceous materials such as graphite.

For carbon-based anodes, the reaction is $$X\ e^- + X\ Li^+ + C \rightarrow Li_xC \qquad \text{Eqn 1}$$

If lithium ions arrive at the anode faster than they can intercalate into the anode material, some lithium ions are reduced to metallic lithium on the surface of anode material particles. This is known as lithium plating.

$$X\ e^- + X\ Li^+ \rightarrow X\ Li \qquad \text{Eqn 2}$$

In such processes, lithium ions that are not successfully incorporated into the anode material deposit as metallic lithium on the anode. When lithium plating happens, it typically happens toward the end of a charge process, when the potential of the anode is at its most negative, and closest to the potential of lithium metal. Thus, lithium plating typically occurs when the state of charge (SOC) is high, e.g., around 90-100%. Various factors influence the degree to which plating happens. Among them are the choice and conductivity of electrolyte formulations, the balance between anode and cathode capacities and surface areas, and the conditions under which the cell is operated (e.g., temperature and charge rate).

Once plating begins, it can lead to further plating, resulting in a number of negative consequences. These include (a) permanent loss of cyclable lithium, which reduces the overall cell capacity, (b) small short circuits caused by metallic lithium dendrites, which reduce the battery's coulombic efficiency, (c) irreversible consumption of electrolyte by reaction with the metallic lithium, and (d) safety risks due to possible dendrite formation, which can lead to large shorts and thermal runaway and, in worst case scenarios, explosive energy release.

Detrimental lithium plating is described in various sources including (1) a presentation titled "Lithium Plating in Lithium-Ion Cells," which was presented by the Aerospace corporation (Zimmerman, Albert H., and Quinzio, Michael V.) at the National Aeronautics and Space Administration Battery Workshop on Nov. 16, 2010, (2) an online publication titled "Li Ion Battery Aging, Degradation, and Failure," by Harris, Stephen J., published electronically at lithiumbatteryresearch.com on or before Mar. 15, 2017, (3) an article titled "Lithium-ion batteries: Phenomenon of 'lithium plating' during the charging process observed," by Heddergott A., published by Science Daily on Sep. 3, 2014, and (4) a research paper titled "Lithium plating behavior in lithium-ion cells," by B. V. Ratnakumar and M. C. Smart, published on Apr. 10, 2010 in *ECS Transactions* 25.36 (2010): 241-252. Each of these references is incorporated herein by reference in its entirety.

In general metal plating is undesirable and should be minimized.

SUMMARY

One aspect of the present disclosure relates to methods of mitigating metal plating on an intercalation negative electrode during a charging process applied to charge a rechargeable battery. Such methods include operations of (a) charging the rechargeable battery using a first charging process; (b) detecting that the metal has plated or is plating on the negative electrode during the first charging process by using a non-invasive technique; and (c) adjusting the first charging process (in response to detecting that has plated or is plating) to produce a second charging process that mitigates or stops metal plating produced by the first charging process. The method described may, in some cases, be used to charge a lithium ion rechargeable battery, where the intercalation negative electrode may include a carbon, tin, or silicon intercalation material.

In some cases, the first and second charging processes are part of a single charging cycle. In other cases, the first charging process may be part of a first charging cycle and the second charging process is part of a second charging cycle, where the rechargeable battery is discharged between the first and second charging cycles.

In some cases, charging the rechargeable battery using a first charging process may include applying a substantially constant charge current to the rechargeable battery, and in some cases, it may include applying a substantially constant charge voltage to the rechargeable battery. In some cases, the first charging process may include applying a substantially constant charge current to the rechargeable battery, followed by applying a substantially constant charge voltage to the rechargeable battery.

In some cases, a plurality of charge pulses may be applied to the rechargeable battery during the first charging process. In one example, a first charge pulse has a predetermined magnitude, and each additional charge pulse has a magnitude that is substantially equal to or less than the magnitude of the first charge pulse.

In some cases, the non-invasive technique used to detect that metal has plated or is plating on the negative electrode during the first charging process includes monitoring a current and/or voltage produced by the rechargeable battery. In some cases, after completing the first charging process, a voltage is measured between terminals of the rechargeable battery and compared to an expected voltage to determine if plating has occurred. For example, plating may be detected if the measured current is greater than the expected current. In some cases, the non-invasive technique may include (i) measuring a current produced by the rechargeable battery at a defined point (e.g. at a defined state of charge) during the first charge process, and (ii) determining that the measured current is greater than expected current at the defined state of charge for the rechargeable battery.

An expected current may be determined from a model of the rechargeable battery. The model of the rechargeable may, in some embodiments, relate the expected current or voltage to a state of charge of the rechargeable battery, a duration of the first charging process, and/or the rechargeable battery temperature. In some cases, the model of the rechargeable battery may predict the expected current based on a battery type and/or a battery state of health of the rechargeable battery. In some cases, the model of a rechargeable battery may be created from empirical data of a particular battery type. In some cases, the model represents the rechargeable battery as one or more resistors and one or more capacitors in a circuit.

In some cases, adjusting the first charging process includes terminating the first charging process upon detecting that the metal has plated or is plating on the negative electrode.

In some cases, where the second charging process is conducted in a different battery charging cycle than the first charging process, a regime may be identified in the first charging process that is responsible for plating the metal on the negative electrode. If a regime is detected, the second charging process may be produced such that it does not include the regime identified in the first charging process. In some cases, identifying a regime includes identifying a termination current.

In some cases, adjusting the first charging process may involve discharging the rechargeable battery by a defined amount to remove at least some of the metal that has been plated on the negative electrode during the first charging process. In some cases, discharging the battery includes discharging the battery at a constant current. In some cases, discharging the battery includes discharging the battery via a plurality of discharge pulses, which may, in some cases, vary in amplitude and/or duration.

In some cases, the second charging process includes applying a second charge current that has a magnitude that is on average less than that of a first charge current applied during charging of the rechargeable battery using the first charge process.

In some cases, adjusting the first charging process includes increasing the temperature of the rechargeable battery. Increasing the temperature of the battery may be done by discharging the rechargeable battery through a resistive heating element that is thermally coupled to the battery. In some cases, the temperature of the battery may also be increased by repeatedly charging and discharging the battery over a range of about 0.5% to about 1% of a full state of charge range of the rechargeable battery. In some cases, adjusting the first charging process may include measuring a temperature of the rechargeable battery and adjusting the first charging process in accordance with the measured temperature. For example, the applied current applied to the rechargeable battery may be lower than if a lower battery temperature is measured than if a high battery temperature is measured.

In some cases, adjusting the first charge process includes reducing the current of one or more charge pulses applied to the battery before entering a constant voltage charge mode of the first charge process. In some cases, the first charge process includes reducing a voltage applied to the rechargeable battery during a constant voltage charge mode of the first charge process.

Another aspect of the disclosure pertains to an apparatus for charging a rechargeable battery wherein the apparatus includes charge circuitry, monitoring circuitry, and control circuitry. The charge circuitry is coupled to the battery and is configured to charge the rechargeable battery during a charge process. The monitoring circuitry is also coupled to the battery and is configured to measure a terminal voltage of the battery. The control circuitry is coupled to the charging circuitry and the measuring circuitry, and is configured to (i) receive data which is representative of the measured voltage, and (ii) output one or more control signals to the charging circuitry. The control circuitry is further configured to (a) identify that metal has plated or is plating on an intercalation negative electrode of the rechargeable battery during charging of the battery by determining that the measured terminal voltage deviates from an expected voltage provided by a battery model, and (b) adjust the charge process applied to the rechargeable battery by via the one or more control signals.

In some embodiments, the control circuitry may be configured to adjust the charge process so that at least one discharge pulse is applied to the battery. The control circuitry may be further configured to estimate an amount of metal that has been plated on the intercalation negative electrode, and substantially remove the plated metal via the at least one discharge pulse.

In some embodiments, monitoring circuitry may be further configured to measure a temperature of the rechargeable battery, and the expected voltage in (a) may be dependent on the measured temperature.

In some embodiments, the monitoring circuitry may be further configured to measure a current produced by the rechargeable battery during the charge process. In these cases, the control circuitry may be configured to identify that metal has plated the intercalation negative electrode of the rechargeable battery by determining that the measured current deviates from an expected current provided by the battery model. These and other features of the disclosure will be presented in more detail below with reference to the associated drawings.

BRIEF DESCRIPTION OF THE DRAWINGS

In the course of the descriptions to follow, reference will be made to the attached drawings. These drawings show different aspects of some implementations, and where appropriate, reference numerals illustrating like structures, components, materials and/or elements in different figures are labeled similarly. It is understood that various combinations of the structures, components, and/or elements, other than those specifically shown, are contemplated and are within the scope of the present disclosure.

The present disclosures are neither limited to any single aspect nor embodiment thereof, nor to any combinations and/or permutations of such aspects and/or embodiments. Moreover, each of the aspects of the present disclosures, and/or embodiments thereof, may be employed alone or in combination with one or more of the other aspects of the present disclosures and/or embodiments thereof. For the sake of brevity, certain permutations and combinations are not discussed and/or illustrated separately herein.

includes a significant "undershoot" whereby the discharge pulse removes too much charge from the battery.

FIGS. 3a-3d illustrate current waveforms of charge signals that may be used to charge a battery.

FIGS. 4a-4g depict charge and discharge packets of charging and discharging signals.

Figure 5A:
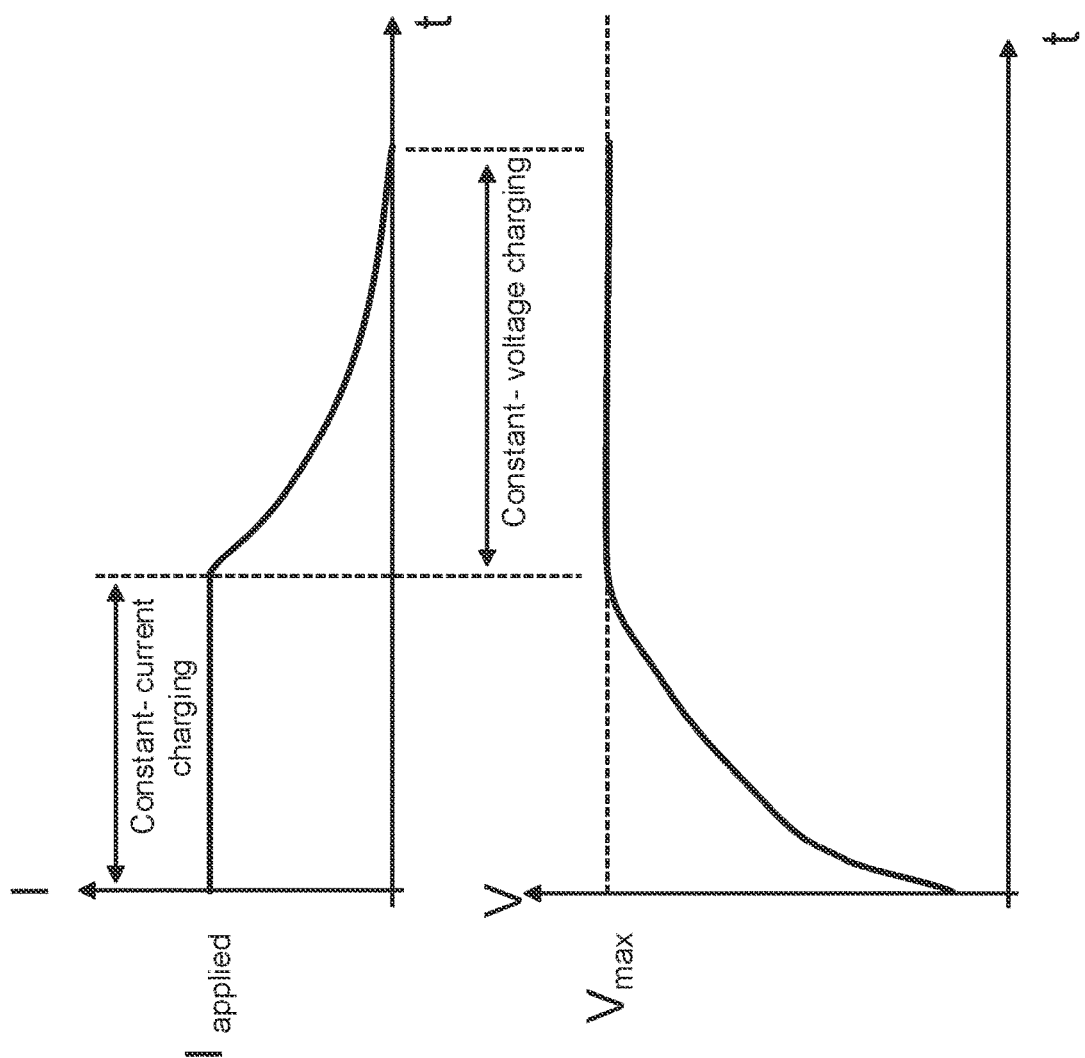
Figure 5B:
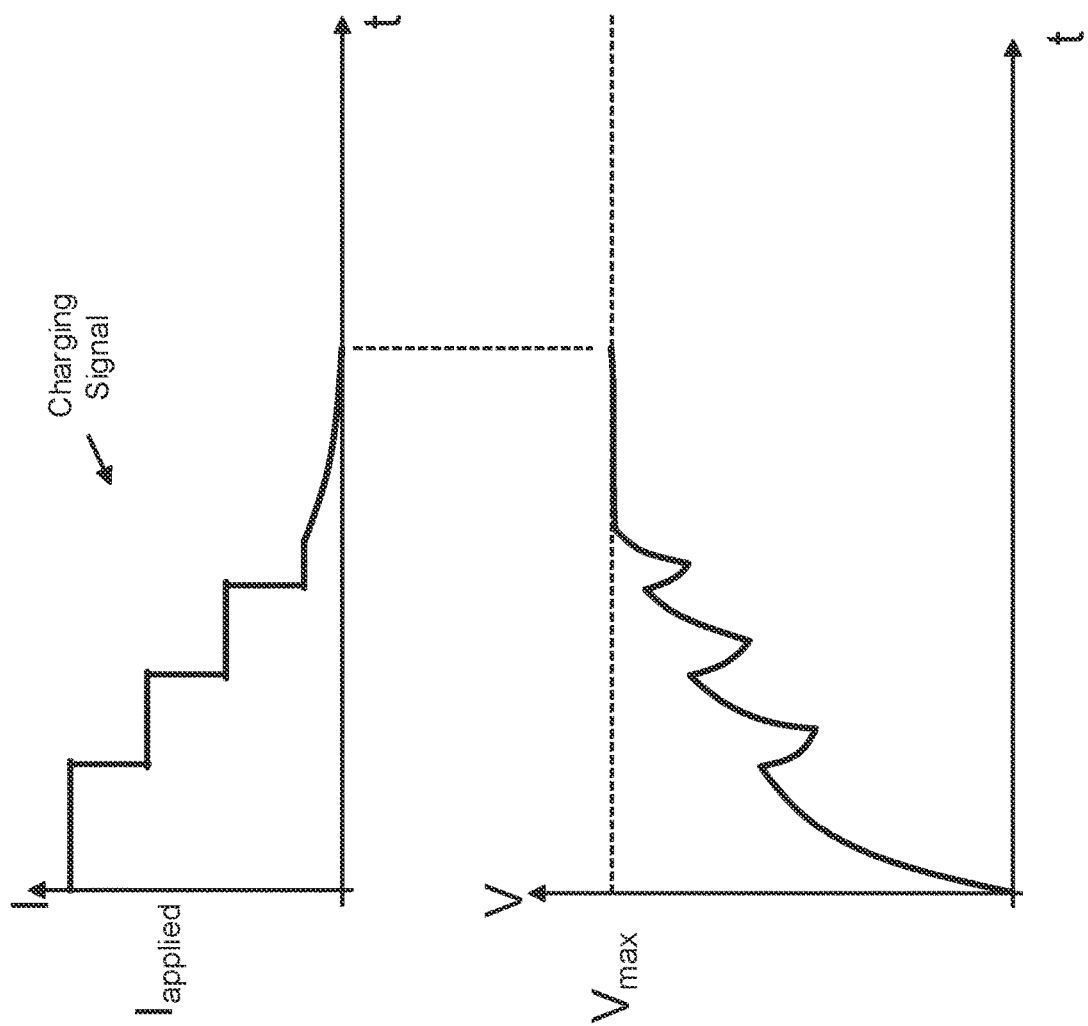

FIGS. 5a-b depict current and voltage waveforms resulting from charging a battery using a constant-current constant-voltage (CCCV) technique and an adapted CCCV technique which includes a plurality of constant charge pulses.

Figure 6:
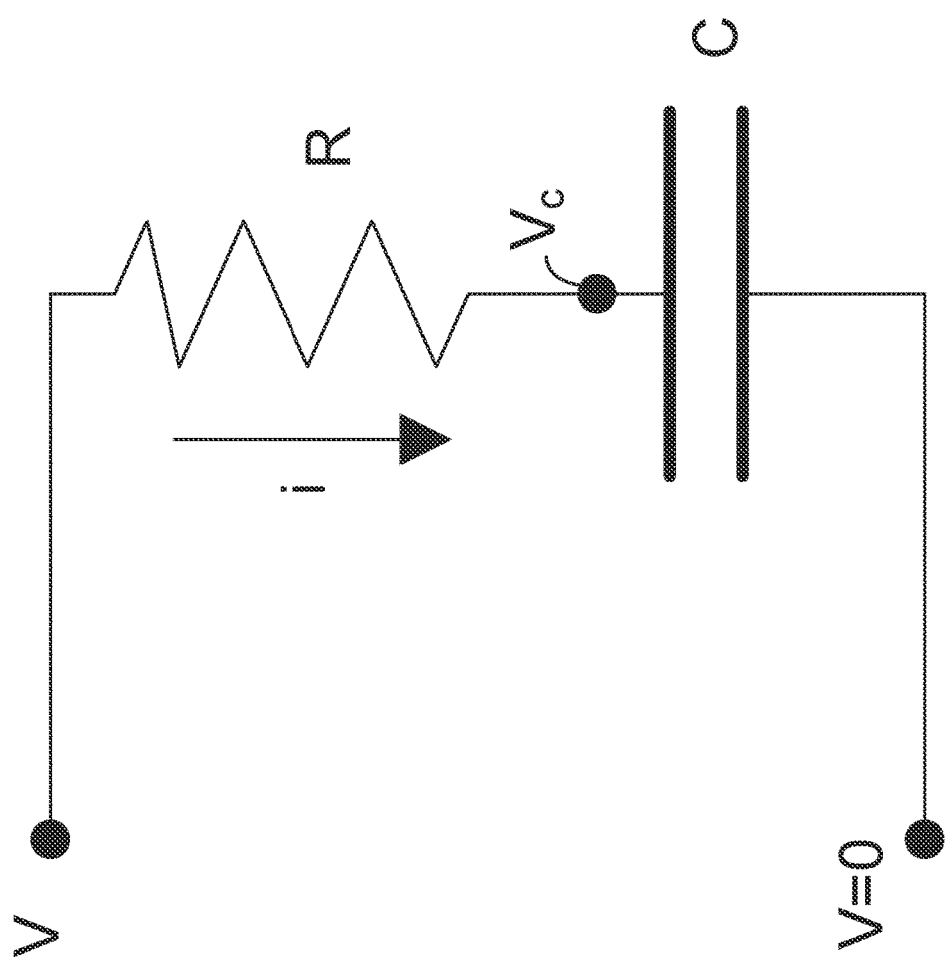

FIG. 6 depicts a simple RC circuit which may be used to model a battery.

Figure 7A:
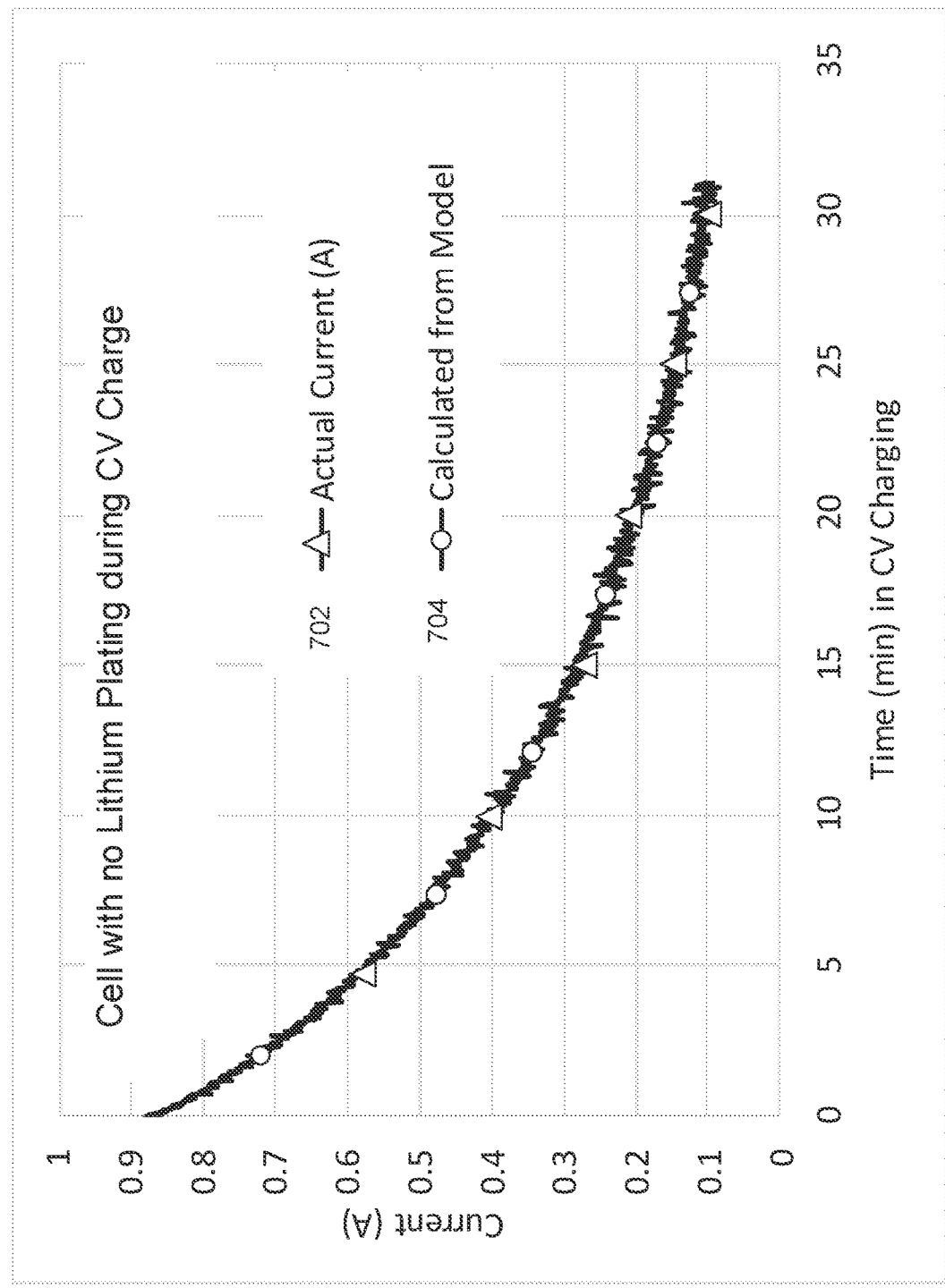
Figure 7B:
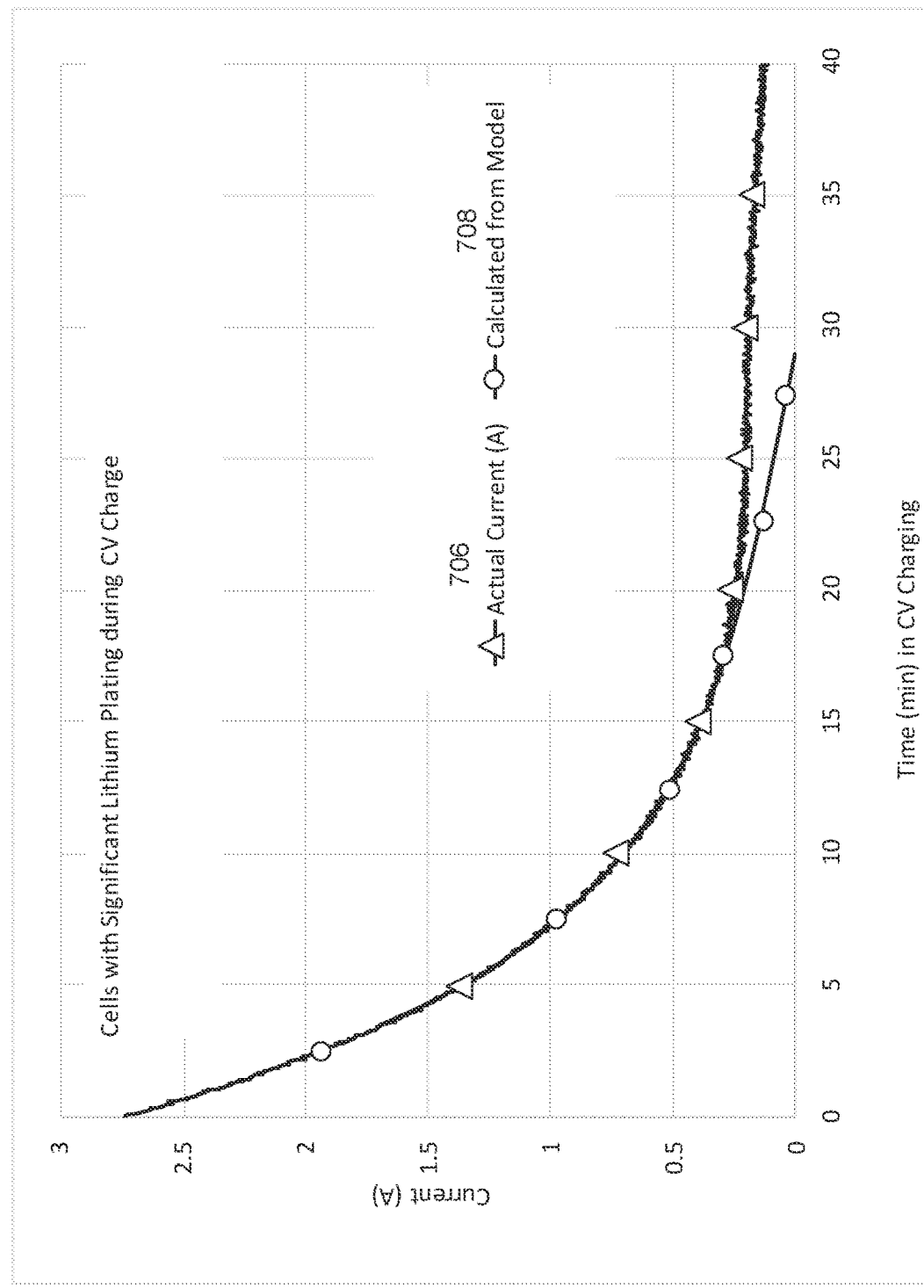

FIGS. 7a-b depict graphs of the measured and predicted charging currents for lithium-ion batteries (unplated and plated) undergoing a constant voltage (CV) charge process as a function of charging time.

Figure 8:
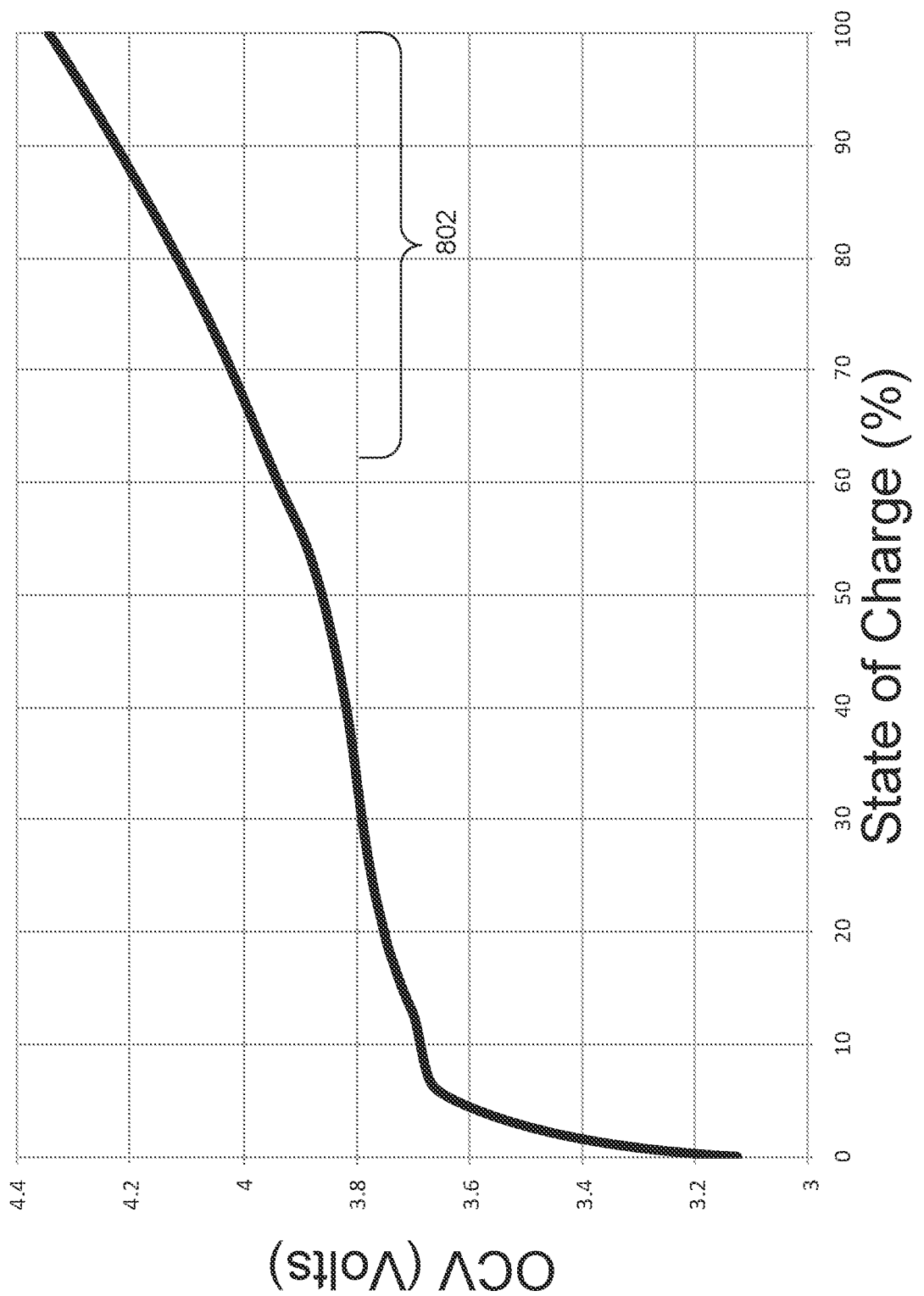

FIG. 8 depicts the open circuit voltage of a battery as a function of SOC.

Figure 9A:
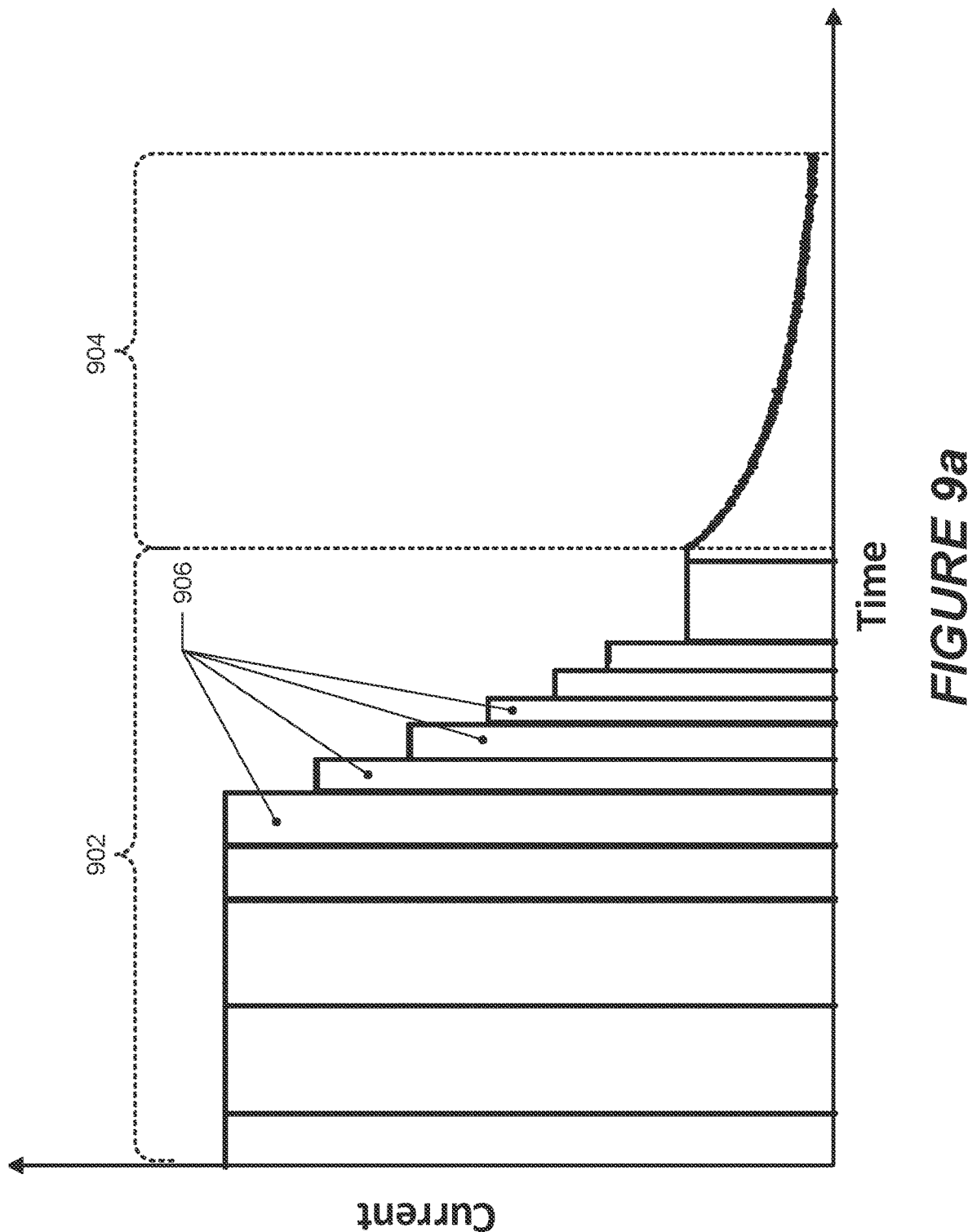
Figure 9B:
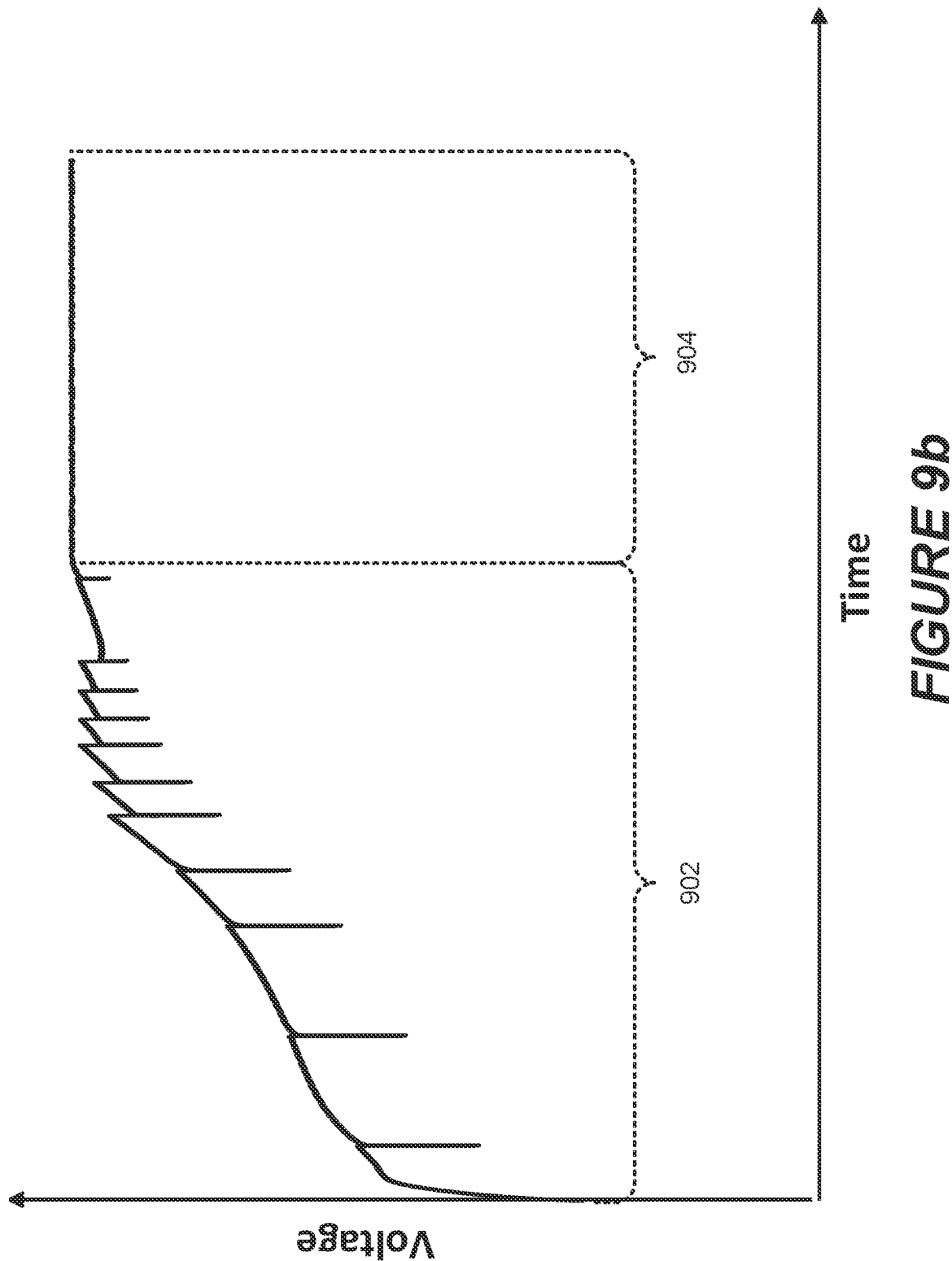

FIGS. 9a-b illustrate current and voltage waveforms that may occur during an adaptive charge process that mitigates metal plating on the anode of a rechargeable battery.

Figure 10:
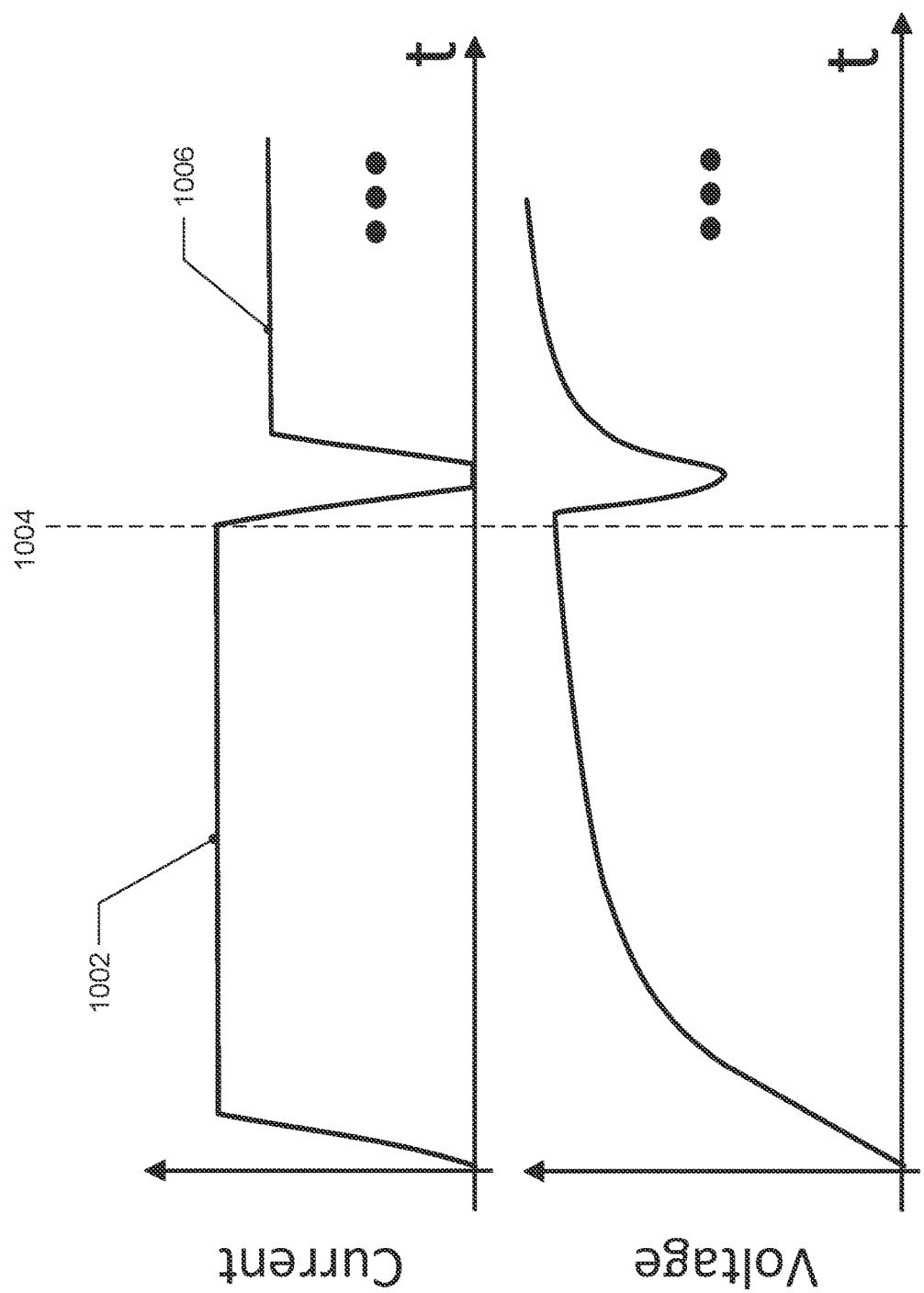

FIG. 10 illustrates an example current and voltage waveforms as a result of an adjustment or adaptation of a charging process once plating or conditions associated with plating have been detected.

Figure 11:
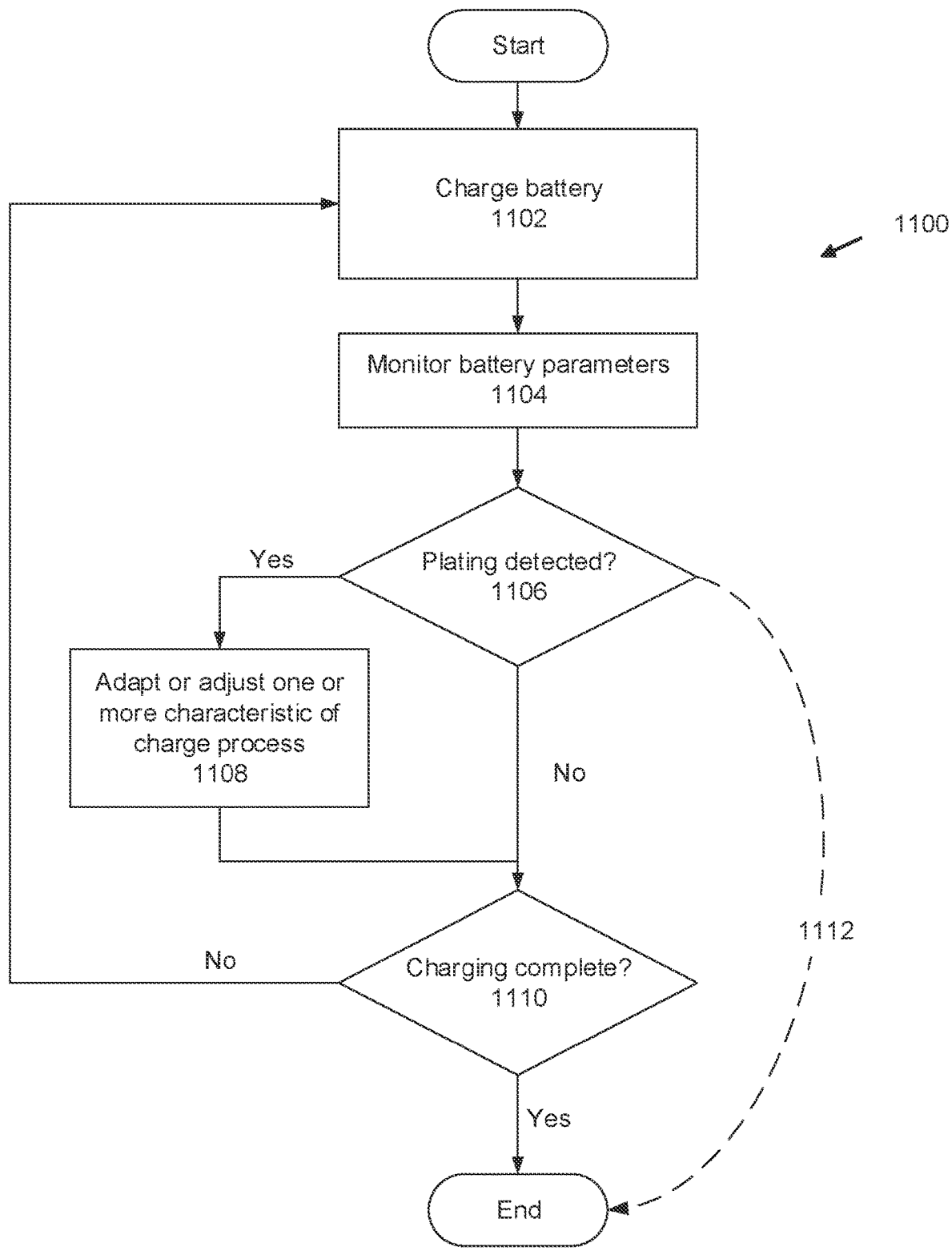

FIG. 11 is a flowchart of an adaptive charging method that may be used to mitigate metal plating when charging a rechargeable intercalation battery.

DETAILED DESCRIPTION

Introduction

In this disclosure, non-invasive methods are described in which batteries are monitored for metal plating (e.g., by monitoring combinations of certain battery parameter values). Determining whether plating has occurred or determination of specific charging conditions that may lead to battery plating may account for the battery type, manufacturer, and/or environmental conditions. In some cases, one or more characteristics of a charge process are adjusted or adapted to maintain battery parameter values within a specified range and reduce or prevent metal plating. In some cases, a battery charge process is adjusted to remove plating metal from a battery's anode by a discharge pulse or other technique.

In many implementations, battery systems are designed or adapted to capture the necessary parameter values and monitor and/or adaptively charge a rechargeable battery or device.

Terminology

The term "battery" as used herein refers to one or more galvanic cells (each of which stores energy electrochemically). A battery may be an individual cell and/or a plurality of cells arranged electrically in a series and/or parallel configuration. Although some technical materials describe a battery as including two or more cells, the term "battery" is not so limited in this disclosure. In some implementations, a battery is a single cell or multiple cells connected in series or parallel to provide a desired voltage or current rating. Batteries considered herein are typically rechargeable (secondary batteries) and employ an intercalation anode. Intercalation anodes include an intercalation matrix or substrate such as carbon, tin, and/or silicon that is configured insert or intercalate ions during charge. These ions are typically alkali metal ions (e.g., lithium or sodium ions) or alkaline earth metal ions.

"Battery type" distinguishes classes or groups of batteries from one another. Among the factors that identify a battery type are (i) battery chemistry (e.g., lithium ion (Lit) batteries and nickel metal hydride batteries), (ii) battery format (e.g., cylindrical versus prismatic versus pouch) and size (e.g., 18650 versus AA), (iii) manufacturer identity (e.g., Samsung versus Panasonic), (iv) manufacturing process, and (v) manufacturer process implementation (e.g. lot, plant, and/or site). An example of a battery type is an 18650 format rechargeable lithium-ion battery produced by a particular manufacturer (e.g., Samsung, LG, Sony, etc.) produced in a particular lot using a particular process of the manufacturer. Any one or more of the above factors may be used to define a battery type. Further, the factors may be defined specifically. For example, lithium ion batteries may be divided into types of negative electrodes such as graphite, silicon, and tin or tin oxide.

"Battery Control Logic" refers to the control algorithms and/or rules that are used for determining charging parameters (for example, the amplitude, width, and frequency of charge and discharge pulses) in the charge process. In some embodiments, the algorithms or rules are chosen to improve or balance a battery's cycle life and/or charge speed. In some embodiments, the algorithms or rules are chosen to reduce, eliminate, or mitigate metal plating on a battery electrode. Battery control logic may make use of state of health (SOH) information and/or battery feedback measurements that may include the state of charge (SOC), temperature, voltage, current, and the voltage response shape due to charging and discharging cycles. In certain embodiments, battery control logic is implemented as executable instructions or code stored in hardware (e.g., any of various forms of memory), firmware, or software. The battery control logic may also be considered to include one or more processors configured or designed to execute the instructions or code, particularly when such processors are directly linked to the memory or other storage providing the instructions or code. Unless otherwise stated, the terms battery control circuitry and control circuitry are equivalent to battery control logic.

A "charge signal" refers to the electrical current (e.g., the current waveform) that passes through the terminals of a battery as a result of circuitry configured to apply charge (a charging signal) or remove charge (a discharging signal) from a battery. A charging or recharging sequence, operation, process, or cycle may include one or more charge signals, which, in total, inject or apply charge into the battery and, optionally, one or more discharge signals (e.g., discharge signals), which, in total, remove charge from the battery. A charge signal may include a plurality of charge packets and/or discharge packets. Each charge packet may contain one or more charge pulses, discharge pulses and rest periods. The pulses may be any shape (for example, rectangular, triangle, sinusoidal or square). In some cases, a charge pulse has a temporal duration of between about 1 ms to about 500 ms.

Figure 1:
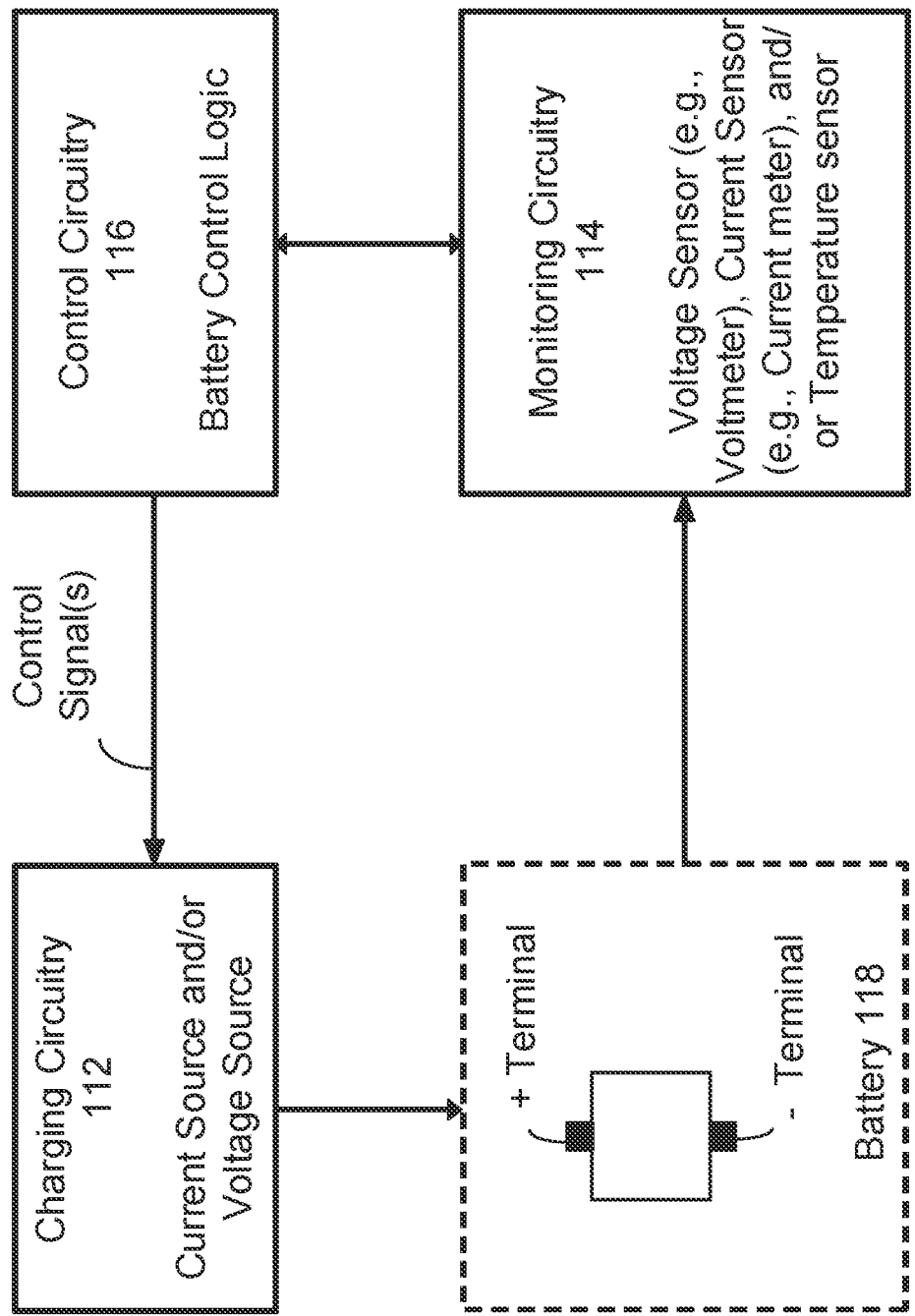
FIG. 1 illustrates, in block diagram form a "battery charging system" or a "battery monitoring system" in conjunction with a battery where charging circuitry 112 (including, e.g., a voltage source and/or current source) responds to control circuitry 116 which receives battery information from monitoring circuitry 114 (including, e.g., a voltmeter and/or a current meter).

A "battery monitoring system," which may be part of a "battery charging system," is used to monitor a battery and use measured parameter values obtained from the battery (and/or characterizing conditions under which the battery is charged or otherwise operated) to determine whether the battery has plated metal. In various embodiments, the monitoring system uses a battery model to determine whether the battery has plated metal. FIG. 1 depicts in block form a battery charging system that includes charging circuitry 112 that responds to control circuitry 116 which receives battery information from monitoring circuitry 114.

The charging circuitry 112 is configured to responsively apply electrical charge to the terminals of a battery 118 via a charge signal. The charging circuitry may include a current source and/or a voltage source to provide the charge signal.

The monitoring circuitry 114 is configured to measure, monitor, sense, detect, and/or sample (for example, on an intermittent, continuous and/or periodic basis) one or more conditions or characteristics of the battery. For example, the monitoring circuitry may measure current applied to the battery, a terminal voltage of the battery, and/or a temperature of the battery. The monitoring circuitry provides data which is representative of the condition or characteristics of the battery to control circuitry.

The control circuitry 116 (or the battery control logic), using data from monitoring circuitry 114, calculates, determines and/or assesses one or more battery parameter values which may be representative of conditions and/or states of the battery. In some cases, battery parameters are measured by the monitoring circuitry and provided as an input to a model which returns an expected state or condition of the battery. In some cases, battery control logic may determine or estimates a battery's state of charge (SOC), state of health (SOH), partial relaxation time, overpotential, or whether metal plating has occurred.

Using the data from the monitoring circuitry (or parameters calculated from the data provided by monitoring circuitry) the control circuitry controls (e.g., adapts or terminates) the charge signal(s) applied to a battery via a charge circuitry. For example, control circuitry may determine that metal plating has occurred by inputting data provided by monitoring circuitry in a battery model and upon making this determination terminate the charging process, or initiate charge signals to remove or mitigate the deleterious metal plating effect.

Figure 2:
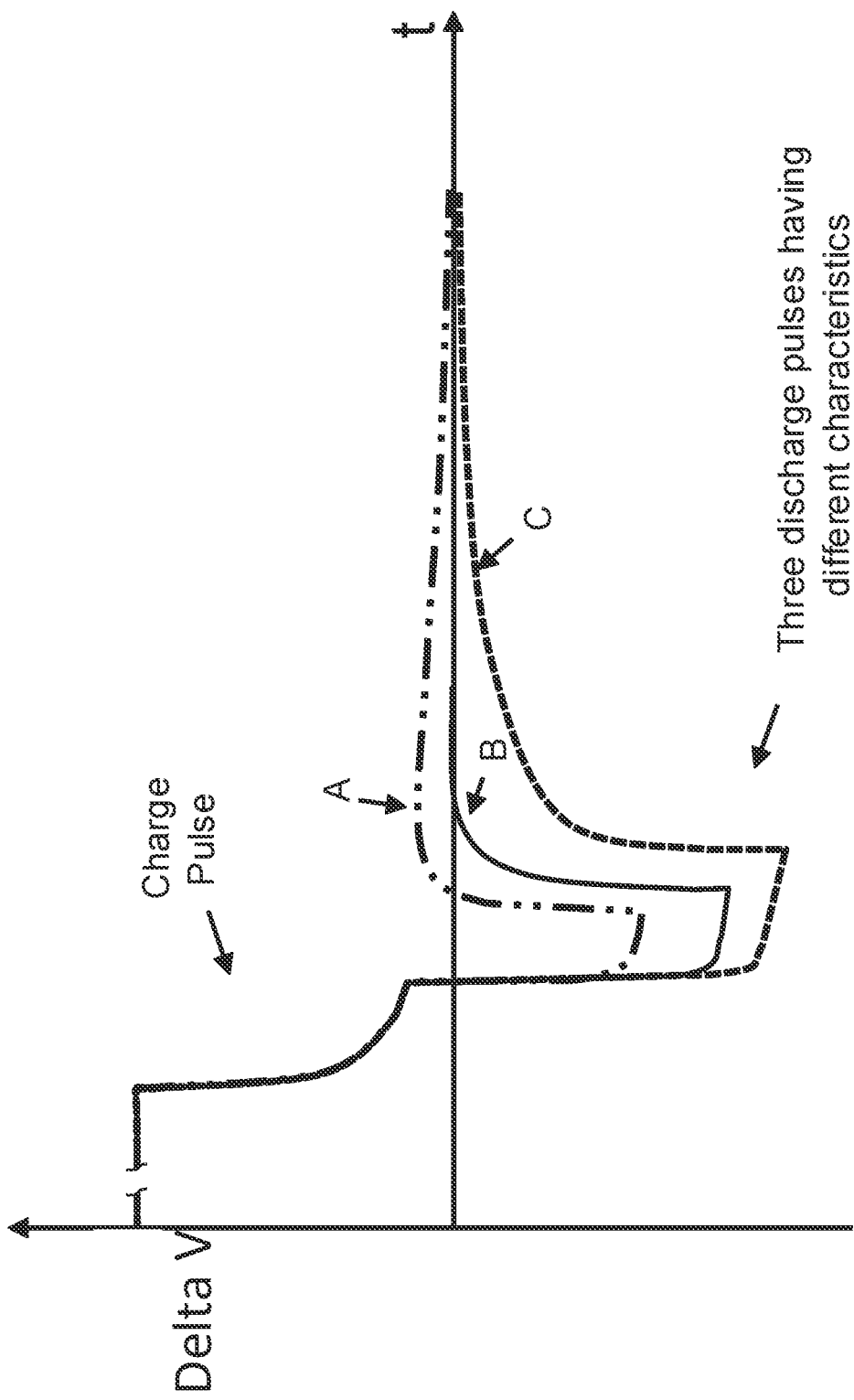
FIG. 2 is an illustration depicting three responses to a charge packet having a charge pulse (which injects charge into the battery) and a discharge pulse (which removes charge from the battery) wherein a first response (A) includes a significant "overshoot" whereby the discharge pulse removed too little charge from the battery, a second response (B) includes no significant "overshoot" or "undershoot" wherein the discharge pulse removes a suitable amount of charge which provides the fastest partial relaxation time of the three responses, and a third response (C)
Figure 3A:
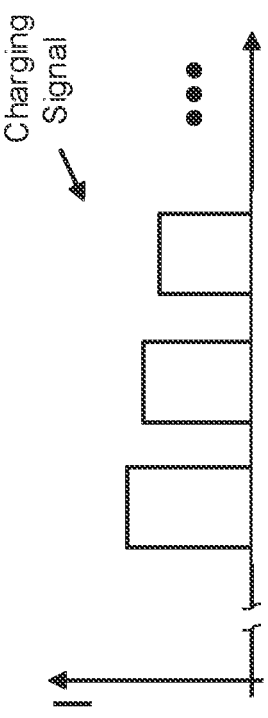
Figure 3B:
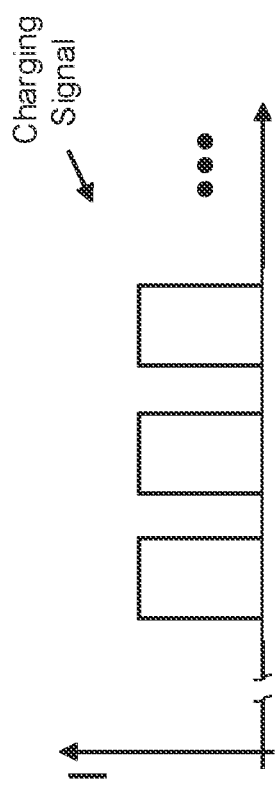
Figure 3C:
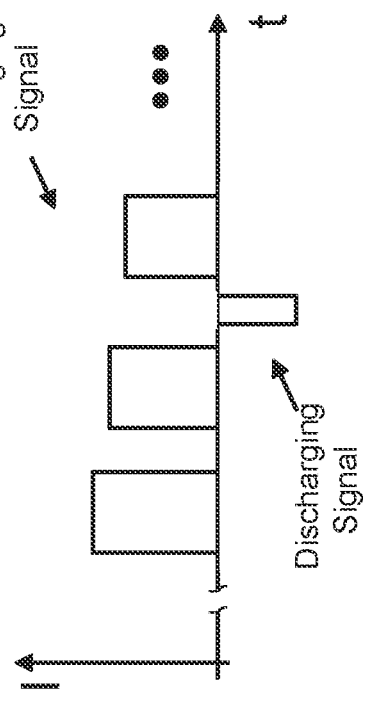
Figure 3D:
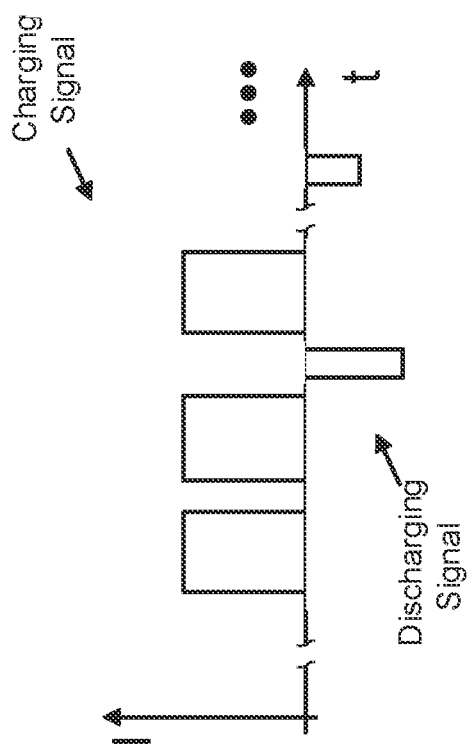

"Charge Process" or "charging process" refers to a process in which a battery is charged from a state of less charge to a state of more charge. During a charge process, the battery's state of charge increases. A charge process may be conducted under the control of charging circuitry which may be part of the battery control logic. In certain embodiments, charging circuitry adapts, adjusts and/or controls the amplitude, pulse width, or duty cycle of charging or discharging pulses and/or it adjusts and/or controls the conditions of a constant voltage portion of the charge process. It may perform any of these functions to control or adjust a feature of the battery such as the battery's relaxation time, rate, shape, characteristics of the decay of the terminal voltage of the battery, and propensity to plate metal. For example, as depicted in FIG. 2, charging circuitry may adapt, adjust and/or control the amplitude and pulse width of the discharge pulse to reduce or minimize the "overshoot" or "undershoot" of the decay of the terminal voltage of the battery.

A "charge cycle" is the process of charging a rechargeable battery and discharging it with a particular load. In some implementations, a charge cycle means charging and discharging an amount of charge that is equivalent to the battery's capacity, but not necessarily by one full charge and one full discharge. For instance, using half the charge of a fully charged battery, recharging it, and then using the same amount of charge again count as one charge cycle. The number of charge cycles to failure indicates how many times a rechargeable battery can undergo the process of complete charging and discharging until failing certain criteria. The number of charge cycles may be used to specify a battery's expected life, which may affect battery life more than the mere passage of time.

"Capacity" or nominal capacity refers to the total Amp-hours available when the battery is discharged at a certain discharge current (which may be specified as a C-rate) from 100 percent state-of-charge to a defined cut-off voltage. A battery's capacity may change over multiple charge cycles. In conventional batteries, it is not uncommon for the battery's capacity to decrease or "fade" over multiple cycles.

The term "capacity fade" refers to reduction of battery capacity over time or charge cycles. It may be based on a maximum of the battery capacity or other reference values of battery capacity (e.g., 85% of initial maximum capacity, capacity at specific terminal voltage, etc.)

Terminal voltage is the voltage between the battery terminals. Terminal voltage may vary with state of charge and discharge or charge current. The terminal voltage may be measured with or without current flowing through a load. In the latter case, the terminal voltage is an open circuit voltage.

"State of charge" (SOC) may refer to the present battery capacity as a percentage of maximum capacity. SOC is used to characterize how far a battery in use has progressed between a fully charged state and a discharged state. State of charge may be calculated using current integration to determine the change in battery capacity over time or charge cycles.

The "state of health" (SOH) of a battery is a parameter that characterizes the "age" of the battery and/or ability of the battery to hold charge, for example, relative to a given time in operation (for example, the initial time in operation). The SOH of a battery provides information to estimate, calculate, measure, and/or determine other battery parameters such as the ability of a battery to hold a charge. The voltage at the terminals of the battery at a given SOC changes as the SOH changes, and hence the voltage curve (voltage versus state of charge) of the battery shifts as it ages and its SOH deteriorates. The state of health parameter is further described in U.S. Pat. No. 9,121,910, issued Sep. 1, 2015, which is incorporated herein by reference in its entirety.

An "electronic device" as indicated herein refers to a device that performs any number of tasks or functions electrically and can be powered by a battery. The device may or may not physically include (e.g., enclose or attach) the battery, battery charging system, or control logic described herein. Electronic devices may be portable or fixed. Examples of electronic devices include mobile phones, digital cameras, laptops, portable speakers, battery powered vehicles, systems for storing solar and other home generated electrical energy, and power tools.

"Metal plating" refers to the electrochemical deposition of metal on an electrode. The process is sometimes referred to as electroplating. In various embodiments, metal plating occurs by electrochemical reduction of metal ions on a negative electrode (cathode during charge). Often metal plating occurs as a result of charging a battery in a regime where a combination of charging parameters and environmental parameters make plating favorable. For example, metallic lithium may inadvertently plate on a carbon-based intercalation electrode during charging of a lithium ion battery.

A "battery model" or simply "model" as used herein represents or predicts a terminal voltage and/or current of a battery as a function of parameters such as the battery's temperature and/or state of charge. In certain embodiments, a model can be used to determine whether metal plating has occurred on an electrode. In this regard, the model may predict an expected current or voltage, which can be compared against a measured terminal current and/or voltage. If the measured value(s) deviates from the predicted value(s) by more than a threshold amount, the charging system may determine that plating has occurred or has likely occurred. In some cases, a model may be used to identify how much metal has been deposited during charging or removed during discharging. In some cases, certain ranges or patterns found within battery parameters provided to a model are correlated to metal plating of the electrodes.

A model may be applicable to a particular battery type (e.g., a particular battery chemistry, cell dimensions, manufacturing batch, etc.). In some cases, a model may account for the state of health of a battery. For example, if irreversible damages to the battery cell have occurred, a model may reflect the battery's state of health.

A model may use battery parameters such as charging voltage, discharging voltage, open circuit voltage, charging current, discharging current, state of charge, and battery temperature as inputs or fixed parameters. In some cases, a model outputs a battery's terminal voltage when it receives current and charge time or state of charge as inputs. In some cases, a model outputs a battery's current when it receives terminal voltage and charge time or state of charge as inputs. A model may include lookup tables, expressions such as regression relationships, neural networks, and the like. In some cases, a model may treat the battery as a combination of one or more resistors and one or more capacitors that may be electrically connected in series, in parallel, or in a combination where some elements are in series and some are in parallel. In some cases, the battery is modeled as a two terminal device and in some cases as a three or more terminal device. A model may relate any two parameters in a linear relationship or a non-linear relationship. For example, some models may treat the relationship between charge and voltage as linear, while other models treat the relationship as non-linear.

An "open circuit voltage" (OCV) is the terminal voltage of a battery when it is not under an external load. It is a property of the cell. A closed circuit voltage (CCV) is the battery terminal voltage under load (e.g., during charging of the battery). CCV is affected by OCV, but also depends on the operation of the battery. For example, during constant current charging, a CCV may be calculated as the sum of the OCV and the charging current multiplied by the resistance of the battery. During constant voltage charge, the CCV is equal to the applied voltage.

A "charge pulse voltage" is a voltage measurement that may be taken to determine a battery parameter or (such as SOC or SOH). In some cases, a CPV measurement may be used by an adaptive charging process. A CPV may be characterized as (i) a peak voltage, measured at the terminals of the battery/cell, which is in response to a charge pulse and/or (ii) a substantial peak voltage (i.e., within 5-10% of the peak voltage), measured at the terminals of the battery/cell, which is in response to a charge pulse. "Measuring," "collecting," or "capturing" a parameter as stated herein is a way of obtaining a value of the parameter. For instance, measuring the voltage of a battery can mean using an instrument such as a voltmeter to directly measure the voltage between terminals of the battery. In some contexts, it means obtaining parameter values related to raw measurements of the battery and/or deriving other information about the battery (e.g., partial relaxation, battery swelling, etc.). Raw measurements of a battery may include current, charge passed or coulombs injected into the battery, voltage, and temperature.

Numeric ranges are inclusive of the numbers defining the range. It is intended that every maximum numerical limitation given throughout this specification includes every lower numerical limitation, as if such lower numerical limitations were expressly written herein. Every minimum numerical limitation given throughout this specification will include every higher numerical limitation, as if such higher numerical limitations were expressly written herein. Every numerical range given throughout this specification will include every narrower numerical range that falls within such broader numerical range, as if such narrower numerical ranges were all expressly written herein.

The headings provided herein are not intended to limit the disclosure.

Unless defined otherwise herein, all technical and scientific terms used herein have the same meaning as commonly understood by one of ordinary skill in the art. Various scientific dictionaries that include the terms included herein are well-known and available to those in the art. Although any methods and materials similar or equivalent to those described herein find use in the practice or testing of the implementations disclosed herein, some methods and materials are described.

As used herein, the singular terms "a," "an," and "the" include the plural reference unless the context clearly indicates otherwise.

The logical connector "or" as used herein is inclusive unless specified otherwise. As such, condition "A or B" is satisfied by "A and B" unless specified otherwise.

Adaptive Charging to Balance Charging Speed and Cycle Life

Adaptive charging as described herein refers to charging processes that make use of feedback related to battery conditions, environmental conditions, user behavior, user preferences, and the like. Using adaptive charging techniques, one or more characteristics of a charge signal may be continuously or periodically adjusted or controlled while charging a battery. For example, adaptive charging may be performed to maintain battery parameter values within a selected range. For example, adaptive charging may keep a battery charge process operating in regime where little or no metal plating occurs or is likely to occur. Adaptive charging parameter values are captured and used to control or adjust a battery's charging process, typically to optimize the battery's cycle life (e.g., by reducing or preventing metal plating on the anode) and/or to optimize charge speed. Various adaptive charging techniques are described in applications assigned to Qnovo Inc. of Newark, CA. Examples of such patents include U.S. Pat. No. 8,638,070, titled "METHOD AND CIRCUITRY TO ADAPTIVELY CHARGE A BATTERY/CELL," issued Jan. 28, 2014; U.S. Pat. No. 8,791,669, titled "METHOD AND CIRCUITRY TO ADAPTIVELY CHARGE A BATTERY/CELL," issued Jul. 24, 2014; U.S. Pat. No. 9,121,910, titled "METHOD AND CIRCUITRY TO ADAPTIVELY CHARGE A BATTERY/CELL USING THE STATE OF HEALTH THEREOF," issued Sep. 1, 2015; U.S. Pat. No. 9,142,994, titled "METHOD AND CIRCUITRY TO ADAPTIVELY CHARGE A BATTERY/CELL," issued Sep. 22, 2015; U.S. Pat. No. 9,035,623, titled "MONITOR AND CONTROL CIRCUITRY FOR CHARGING A BATTERY/CELL, AND METHODS OF OPERATING SAME," issued May 19, 2015; and U.S. Pat. No. 8,907,631, titled "ADAPTIVE CHARGING TECHNIQUE AND CIRCUITRY FOR A BATTERY/CELL USING MULTIPLE CHARGING CIRCUITS AND TEMPERATURE DATE," which issued Dec. 9, 2014. Each of these patents are incorporated herein by reference in their entireties.

Parameters that may be used for adaptive charging include charge pulse voltage, charge pulse voltage reference, partial relaxation time, the state of charge, and the battery's state of health. In some cases, ranges of acceptable values of each of these parameters may vary as a function of the state of charge during the charge portion of a battery cycle. The parameters values may also vary from cycle-to-cycle over the battery's life. In some cases, adaptive charging may also make use of the current charging parameters such as the current that is being applied to a battery or the terminal voltage that is applied charging circuitry. To illustrate conventional adaptive charging, FIG. 2 illustrates how a charging process can reduce or minimize the "overshoot" or "undershoot" of the decay of the terminal voltage of the battery by adjusting the amplitude and pulse width of a discharge pulse. When a charge process provides an "overshoot" of the decay of the terminal voltage of the battery relative to partial equilibrium (see discharge pulse A), the control circuitry may instruct charging circuitry to adjust the characteristics of the discharge pulse and increase the amount of charge removed by the discharge pulse. For example, by increasing the amplitude and/or pulse width of the discharge pulse the overshoot may be corrected. When a charge process results in an "undershoot" of the decay of the terminal voltage of the battery relative to partial equilibrium (see discharge pulse C), control circuitry may instruct charging circuitry to decrease the amount of charge removed by the discharge pulse (for example, via decreasing the amplitude and/or pulse width of the discharge pulse). As such, the control circuitry may adjust the characteristics of the discharge pulse of a subsequent charge packet (for example, the amplitude, pulse width and/or pulse shape) to control or adjust rate, shape and/or characteristics of the decay of the terminal voltage of the battery.

FIGS. 3a-3d illustrate waveforms of charge signals. A charging or recharging sequence, operation, or cycle may include charging signals (which, in total, inject or apply charge into the battery) and discharging signals (which, in total, remove charge from the battery). Charging signals may decrease according to a predetermined rate and/or pattern (for example, asymptotically, linearly or quadratically) as the terminal voltage of the battery increases during a charging or recharging sequence, operation, or cycle (see, e.g., FIGS. 3b and 3d). In some cases, a pulse charging sequence or operation may include a constant voltage (CV) phase after a period of pulse charging and/or upon charging the battery/cell to a predetermined state of charge;

FIGS. 4a-4e illustrate charge and/or discharge packets of the charging and discharging signals (which are illustrated in FIGS. 3a-3d), wherein such charge and discharge packets may include one or more charge pulses and one or more discharge pulses. In some embodiments, each charge signal of FIGS. 3a-3d may include a plurality of packets (for example, about 100 to about 50,000 packets) and, in some embodiments, each packet may include a plurality of charge pulses, discharge pulses and rest periods. The pulses may be any shape—for example, pulses may be, rectangular, triangular, sinusoidal, or square. In some embodiments, charge and/or discharge pulses of the packet may include a temporal duration of between about 1 ms to about 2000 ms, and preferably less than 1000 ms. Note that the concept of a "packet" is not essential to characterize a charging process. Some pulse charge processes may be amply described as a series of charge (and optionally discharge) pulses.

Figure 4G:
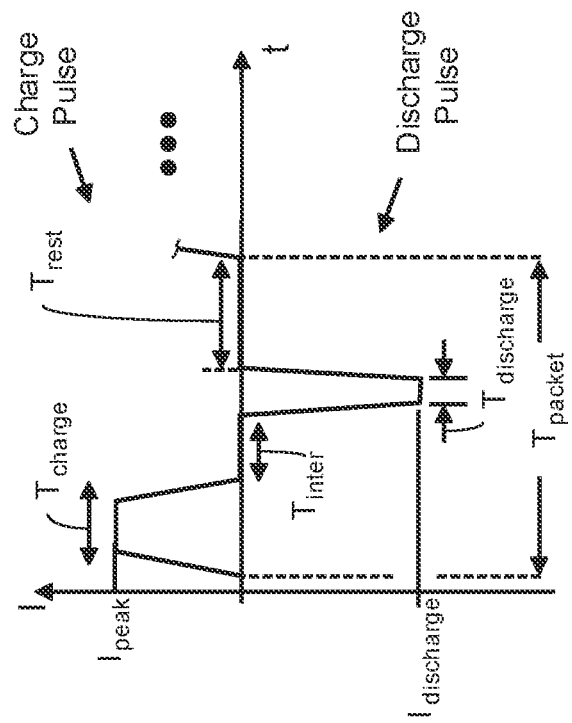
Figure 4F:
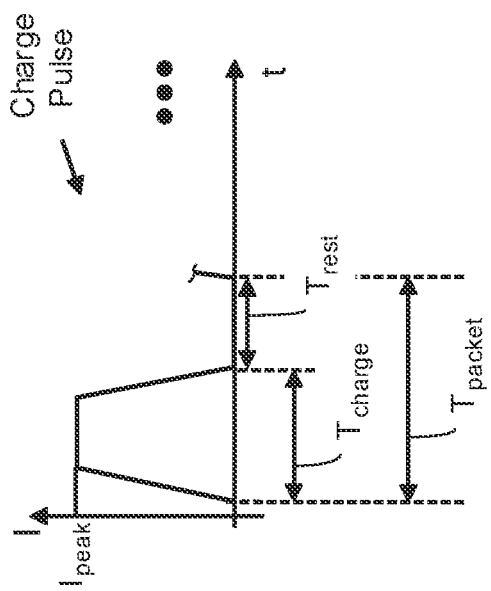

FIG. 4f illustrates an example of a charge packet having a charge pulse that includes a charging period (Tcharge) followed by a rest period (Trest) where the period of the charge packet is identified as Tpacket.

FIG. 4g illustrates an example of a charge packet having a charge pulse (which injects charge into the battery) and a discharge pulse (which removes charge from the battery) where the charge pulse includes a charging period (Tcharge) and the discharge pulse includes a discharging period (Tdischarge). As depicted, an intermediate rest period (Tinter) is disposed between the charge and discharge pulses, and a rest period (Trest) is disposed after the discharge pulse and before the next packet.

Some or all of the characteristics of the charge and discharge pulses may be programmable and/or controllable. For example, the pulse amplitude, width/duration, and shape may be adjusted. In other examples, the amplitude of the positive and/or negative pulses may vary within the packet, the duration and/or timing of the rest periods may vary within the packet, and/or pulses may be equally or unequally spaced within the packet. The combination of charging pulses, discharging pulses and rest periods may be repetitive, thereby forming a packet that may be repeated. All combinations or permutations of pulse characteristics, periods, packets and signal characteristics and configurations are intended to fall within the scope of the present inventions.

FIG. 5a illustrates current and voltage of a battery as a function of time illustrating the conventional charging method known as constant-current, constant-voltage (CCCV). When charging a rechargeable battery (e.g., a lithium-ion type rechargeable battery) using CCCV, the charging sequence includes a constant-current (CC) charging mode until the terminal voltage of the battery/cell is at about a maximum amplitude (for example, about 4.2V to 4.5V for certain lithium-ion type rechargeable batteries) at which point the charging sequence changes from the constant-current charging mode to a constant-voltage (CV) charging mode. In the CV mode, a constant voltage is applied to the terminals of the battery. Generally when charging a rechargeable battery using the CCCV technique, the charging circuitry often changes from the CC charging mode to the CV charging mode when the state of charge (SOC) of the battery is at about 60-80%, although in some embodiments, as described herein, a charging circuitry does not enter a CV charging mode until the battery charge is greater than about 90% SOC or greater than about 95% SOC.

FIG. 5b illustrates current and voltage of a battery as a function of time illustrating a charging method known as a step-charging technique. A step-charging process of a rechargeable battery (e.g., a lithium-ion type rechargeable battery), employs a multiple step constant-current (CC) charging mode until the terminal voltage of the battery is at about a maximum amplitude (for example, about 4.2V to 4.5V for certain lithium-ion type rechargeable batteries) at which point the charging sequence changes from the constant-current charging mode to a constant-voltage (CV) charging mode. As with the CCCV technique depicted in FIG. 5a, a constant voltage is applied to the terminals of the battery while in the CV mode.

Detection of Metal Plating

The following description explains how lithium plating on the anode of a rechargeable lithium-ion battery may be detected and/or quantified. In some cases, the onset of lithium plating is detected so that the charge process may be adapted to avoid further plating of a cell's anode. While this disclosure references the detection of lithium plating in the lithium-ion batteries, methods disclosed herein may also be used to detect metal plating on the anode of other types of rechargeable battery. Unlike some conventional methods, the methods described herein allow for non-invasive detection wherein the battery is not damaged in the process. Some methods may be used during discharge of a battery and other methods may be used during charge of a battery.

When metal plating has occurred on the anode of an intercalation battery, the terminal voltage under load may be lower than if no plating had occurred. A lower terminal voltage is due to increased surface area of the anode from plated lithium metal on the anode surface. The increased surface reduces the cell resistance so that the voltage under load (closed circuit voltage) is lower than normal.

In some cases, plating may be detected under open circuit conditions (rather than charge or discharge under load). When metal plating has occurred on the anode of an intercalation battery, the open circuit voltage may be higher than if no plating had occurred. This is because metallic lithium is more negative than intercalated lithium (e.g., lithiated graphite) by about 65-100 mV, depending on the battery's SOC. As an example, the open circuit voltage when charging or discharging a lithium-ion battery will, after some equilibration (e.g., at least about 30 seconds, or more conservatively at least about 150 seconds), be higher than normal if the battery's anode has ben plated with lithium.

In methods described herein, a battery model may be used to determine whether plating has occurred and/or is likely to have occurred while charging the battery. The battery model may provide an interrelation between one or more measurable parameter such as voltage, current, SOC (which may be obtained by integrating current over time), and battery temperature to predict measurable values of, e.g., terminal voltage for intercalation batteries that are not affected by metal plating. In some cases, the battery model predicts behavior of intercalation batteries in which plating has occurred. A battery charging or monitoring system may compare predicted values against measured values to determine whether plating has occurred or is likely to have occurred.

As an illustrative example, a model predicts the terminal voltage of the battery in response to applying a specific current to charge the battery, where the determined terminal voltage also depends on measured battery conditions such as SOC and temperature. In some cases, a model predicts the current produced by a battery resulting from a specific voltage applied during charging. Such model may employ other battery parameters such as the state of charge and temperature. As mentioned, such models may make the prediction assuming that plating does not occur. A measured value of terminal voltage or current that significantly deviates from the predicted value (for a given set of conditions) suggests that plating has occurred.

In certain embodiments, a battery model is designed to accurately predict battery behavior (e.g., terminal voltage and/or current) over a range of battery types and/or a range of charging conditions or charging process phases. Such models are deemed general models. A specific battery model, by contrast, is designed to accurately predict battery behavior only in a small range of battery types (e.g., only one) and/or only in narrow range of charging conditions or charging process phases. For example, different battery models may be used for different battery types. One model may be appropriate for a battery having capacity A from manufacturer X, while a different model may be appropriate for a battery having capacity B from manufacturer Y. In some cases, different battery models may be used for different portions of a charge process. For example, one model is appropriate for a constant voltage portion of a charge process, while a different model is appropriate for a constant current (or constant current pulses) portion of a charge process. In some cases, different models are used for different states of charge, as defined by particular state of charge values.

In some cases, a battery is modeled as a simple RC circuit as depicted in FIG. 6. While this model assumes ideal behavior, even this simple circuit model may, in some cases or under certain conditions (e.g., over a certain SOC range), predict behavior of a battery with a high degree of accuracy. According to the RC battery model, when a battery is charged with a constant voltage (V), the current (i) applied to the battery decreases with time as shown in (Equation 3), the charge (Q) stored in a battery increases with time (Equation 4), which corresponds to the battery's state of charge, and current is linear function of the charge stored in a battery (Equation 5). Of course, the charged stored in a battery corresponds to the battery's current state of charge.

$$i = \frac{V}{R}\exp\left(-\frac{t}{RC}\right) \qquad \text{Eqn 3}$$

$$Q = VC\left(1 - \exp\left(-\frac{t}{RC}\right)\right) \qquad \text{Eqn 4}$$

$$i = \frac{V}{R} - \frac{Q}{RC} \qquad \text{Eqn 5}$$

Equations 3-5, which described RC model of FIG. 6, are based on the definition of capacitance (C) which is defined as being equal to the charge stored in the capacitor (Q) divided by voltage across the capacitor ($V_c$), such that Q=C$V_c$. In some models, capacitance (C) is a constant value, and in some cases it is not. In other words, the definition of a capacitor may be generalized such that ($V_c$) is not necessarily proportional to (Q), but rather ($V_c$) is just a known function of (Q). In some cases, a battery model accounts for nonlinearities in a network of circuit elements. For example, a model may include any number of resistors and capacitors. The connections between individual capacitors and resistors can be in series, in parallel, or a combination of the two. The connections can be a combination of series, parallel and some pattern that is neither series nor parallel. Although a battery is typically a two-terminal device, the model circuit need not be so limited.

If the measured behavior of a battery during charging differs from the predicted behavior determined by a battery model, this may indicate plating. For example, if while the battery is charging, the voltage predicted by a battery model is lower than the measured voltage, the battery control logic may determine that plating has occurred or has likely occurred. The deviation between predicted behavior and measured behavior is sometimes explainable based on an increased surface area of the negative electrode (the anode) which arises from metal plated to the electrode surface.

Due to imprecision and noise that is inherent when generating measured parameters (e.g., terminal voltage) with monitoring circuitry, battery control logic may use a threshold value or range when determining whether plating has occurred or whether plating is likely to occur under current charging conditions. For example, a charging battery's measured terminal voltage may be 30 mV lower than predicted, but the plating detection logic requires a deviation of at least 50 mV prior to flagging the battery as having plated metal. In this case, the logic would not flag the battery for plating mitigation treatment.

FIGS. 7a 7b depict graphs of the measured and predicted charging current for a lithium-ion battery undergoing a constant voltage (CV) charge process as a function of charging time. The predicted charging current is taken from a battery model that treats the battery as a simple RC circuit (see FIG. 6). FIG. 7a depicts an example of a lithium-ion battery in which substantially no lithium plating has occurred. The lack of lithium plating on the anode of the rechargeable battery can be seen by the measured current 702 which closely aligns with the predicted current 704. FIG. 7b depicts an example of a lithium-ion battery in which lithium plating has occurred or is likely to have occurred. The lithium plating is evidenced by the deviation of the actual measured current 706 from the predicted current 708 predicted using the battery model. The depicted deviation may be due to a reduced resistance at the negative electrode caused by metal plating, where the decreased resistance results in an increase current for constant voltage charging.

In some cases, a simple RC circuit battery model or other linear representation is sufficient for predicting battery charging current during a portion of the charging process (e.g., the CV portion of a charge process). As depicted in FIG. 8, the open circuit voltage (OCV) may be substantially linear with SOC over the SOC range covered by CV charging (see region 802). More generally, in many cases, the relationship may be substantially linear near the end of a charge process, e.g., at SOCs of about 60% or greater. In some cases, there may be some curvature in the OCV vs. SOC relation.

In some cases, there is some curvature in the open circuit voltage versus charge relationship; for example, in the high state of charge portion of the charge process. This curvature can be linearized, substantially linearized, or accounted for in a battery model by making one or more terms of an expression or an equation that defines a battery model non-linear. For example, Q in Equation 5 may be made non-linear to account for a curvature in the open circuit voltage versus charge curve by raising to Q to a power between about 1.1 and about 2. This exponent can be used in the form of a relationship used to fit data or to vary a relationship based on regression of current versus charge data taken from cells that have not exhibited metal plating.

In some cases, a more complicated battery model may be employed to predict battery behavior in lower state of charge portions of a charging process (e.g., less than 50% SOC or in the early portion of a constant current phase of a charging process). In some cases, a more complicated battery model may be employed to predict the behavior of batteries that use charge and/or discharge pulses during charging. In some cases, such battery model includes terms that account for the state of charge of the battery, the temperature of the battery, and/or the charge/discharge history of the battery. A more complicated battery model may include non-linear terms or may be represented by a more complicated circuit representation of a battery. In some cases, a battery model is generated for a particular battery type (and in some cases a battery type from a specific manufacturer) using emperical data measured by testing a sample set of batteries of the same type or from the same manufacturer. Using such data, many forms of model may be generated, as appropriate. For example, as explained, a battery model may predict an essentially linear relation between current and SOC. In its simplest case, it has the form of equation 5. In more general cases, it may contain something similar to equation 5 but contains one or more terms non-linear with Q. The coefficient of these linear or non-linear terms can be used to help detecting lithium plating. For example, for batteries of a particular type, the values of the coefficients should be with a certain range. If they are outside of the normal range, it is an indication of possible plating.

While any amount of plating is considered to be a negative event, it may be useful to quantify the amount of plating, e.g., to determine how much battery capacity has been lost and/or to determine how much current must be applied to undo the plated metal. In some cases, the excess current attributed to metal plating (actual minus predicted) may be used to predict the amount of metal plating. The extent of lithium plating, whether significant or insignificant, may be quantified by integrating the difference between the actual and the predicted current with respect to time. The result of this integration is a value having units of charge, such as coulombs. To provide a normalized value that can be used to describe plating across a range of batteries having various capacities; this value can be expressed as a percentage of the rated capacity of the cell.

In some cases, noise in measurement circuitry may result in uncertainty in a calculation of metal plating. In some embodiments, measurement circuitry and/or a battery model may result in measurements having a standard deviation on the order of about 0.3%. In some cases, the determination of lithium plating may not be made until plating reaches a certain threshold percentage, e.g., greater than about three times an expected standard deviation (or greater than about 1%).

Metal Plating Mitigation Through Adaptive Charging

After detecting lithium plating and/or conditions that might result in lithium plating, appropriate logic may adjust or adapt one or more characteristics of the charge process to prevent further plating, if any, and/or reduce the amount of lithium that is already plated. Alternatively or in addition, after first detecting that lithium plating has occurred, or after reaching battery conditions in which it is determined that plating might likely occur, the charge process may be terminated, thus avoiding degradation of the battery that might occur as a result of continued charging.

In some cases, a plating mitigation or reversal process adapts charging by applying one or more discharge pulses as part of the charging process. For example, after first detecting that lithium plating has occurred, or after reaching battery conditions in which it is determined that plating might likely occur, the battery control logic instructs charging circuitry to initiate one or more discharge pulses from the battery. In some cases, battery control logic is configured so that upon detecting plating or that plating is likely to occur, control signals are sent to charging circuitry to initiate one or more discharge pulses. These discharge pulses may be undetectable or happen without notification to the user of an electronic device. By temporarily discharging the battery, lithium can, in some cases, be removed from the surface on the anode.

Since lithium chemically reacts with an intercalation anode, it can become more difficult to remove if time passes between when plating occurs and when a discharge pulse is initiated. Therefore in certain embodiments, the discharge pulse is applied immediately or within a short period of detecting plating or likely plating. Typically, the discharge pulse is applied before the current charge process is completed, for example the discharge pulse may be applied seconds or minutes from the time when plating or likely plating is detected. In some examples, the discharge pulse is applied within about one hour. To improve the effectiveness the of a discharge pulse, the current amplitude may be high so that the surface of the anode, where plating has occurred, it preferentially discharged. In some cases, a discharge pulse may be about twice the normal or average discharge rate of a battery (e.g., between about 1.5 and 3 times normal or average discharge rate). In some cases, multiple discharge pulses may be applied that are separated by a rest intervals to modulate the average discharge current or prevent overheating of the battery and/or electronics in the battery charging system. In certain embodiments, the amount of charge in a discharge pulse, or a series of pulses, is equal to or greater than the calculated plating coulombs (determined by integrating the excess current which is attributed to metal plating) to ensure that all of the plated lithium is removed. In some embodiments, the plating mitigation strategy employs a plurality of discharge pulses of different amplitude and duration. Such approach can be tailored to avoid overheating the battery. After completing the discharge pulse (or pulses) to strip the plated metal, the battery control logic may reinitiate charging and continue until the battery reaches a determined state of charge (e.g., until the battery is fully charged). In some cases, the battery control logic does not reinitiate charging until the battery has again been discharged by normal use.

In some embodiments, the battery control logic is configured to identify conditions and/or ranges of conditions that are linked to lithium plating in a battery and avoid these conditions in future charge cycles. For example, if plating is detected when charging under constant-current (CC) at a specific SOC, then the current may be reduced as the battery nears that state of charge in the next charge cycle. Similarly, if plating is detected when charging under constant-voltage (CV) at a specific SOC, then the charging voltage may be reduced (or charging may be terminated) to avoid repeating similar conditions that previously resulted in lithium plating. In some cases, the battery control logic may identify conditions that additionally depend on parameters such as battery temperature or a battery's SOH.

In some implementations where plating was detected and a mitigating operation was applied in one charge cycle, the charging logic checks for metal plating during the next cycle. If during the next charge cycle, the battery control logic determines that further plating has occurred, it may then perform further mitigation (e.g., another discharge pulse) to strip the plated metal. Subsequent charging cycles may be performed in this manner, and if plating continues to occur at a particular current, a maximum current (or a termination current) at which charging of the battery is halted during subsequent charge cycles may be set for further cycles.

Metal plating may be correlated with a particular voltage and/or a particular current applied to charge the battery. It has been found that some charging process apply too high of a charging current just before transitioning to CV charging, and under such conditions plating is likely to occur. Therefore, to prevent or reduce the likelihood of plating, the charge process may employ a reduced current at a particular state of charge immediately before or as the charge process approaches the CV phase. As previously discussed, batteries may be charged using CCCV or a variation thereof. An example of a charge process in which the magnitude of the charging current is reduced before entering a CV mode of charging is depicted in FIGS. 9a-b, which are described below.

Alternatively, or in combination with reducing a charging current before entering a constant voltage (CV) mode of charging, the voltage at which a battery enters a CV mode of charging may be reduced to prevent lithium plating. For example, if plating is detected or anticipated upon entering a CV charge mode, then the charging voltage may be reduced in subsequent charge cycles.

In some cases, battery control logic is configured to determine that a battery is too cold and, in response, raise the temperature of the battery before proceeding with a charging process. It has been observed that plating is sometimes correlated with battery temperature and may be more likely to occur if fast charging of a battery is conducted under cold conditions (e.g., an ambient temperature of less than about 20° C. or less than about 10° C.). Under such conditions, increasing the battery temperature prior to or during charging may increase the transport of lithium ions within the battery cell, and prevent or reduce the likelihood of plating. In some cases, the charging system heats the cell by repeatedly charging and discharging the battery over a relatively small portion of the full SOC range (e.g., about 0.5% to 1% of the battery's capacity). When performing rapid charging and discharging to heat a battery, the SOC gain due to charging the battery and the SOC lost due to discharging the battery may be equalized by the battery control logic, resulting in a temperature increase, but no net SOC change. In some cases, if plating has been detected, a discharge pulse of the battery that may be initiated to strip plated metal may also be used to heat the battery. In other words, the amplitude and width of a discharge pulse can be adjusted or optimized by battery control logic to perform both functions. In some cases, a charging apparatus is configured with a heating element that is thermally coupled to the battery, and charging circuitry is configured to route discharge signals from the battery through the resistive heating element. Resistive heating elements may be made from materials such as Nichrome, Kanthal, Copronickel, and other materials conventionally used to convert electricity into heat. In some cases, battery control logic is configured to receive a battery temperature from a sensor that is integrated in a battery or is part of the battery charging apparatus.

In some cases, the charging process is defined such that the current applied to a battery during a CC mode of charging and/or the voltage applied during a CV mode of charging depends on a measured temperature. For example, if a battery is charged under cold conditions (e.g., the battery or ambient temperature is less than about 20° C. or less than about 10° C.), it is charged with a relatively low charging current and if the battery temperature increases during the charging process by, e.g., use of an electronic device associated with a battery or environmental conditions, then the current applied to the battery increases along with the temperature rise. By any of these methods of monitoring and/or increasing a battery's temperature, the battery may be more safely charged to or near a 100% state of charge.

Generally there are two primary portions of the charging process: a constant current portion and constant voltage portion. The constant current portion comes first and sometimes includes a series of constant current pulses. As described herein, this charging phase is sometimes described as the constant current (CC) phase. The number, duration, and magnitude of constant current pulses may be controlled by battery control logic based on parameters such as the battery type, a nominal time to full charge, the voltage during a constant voltage phase, and metal plating mitigation considerations.

Various features of a pulsed CCCV plating process may be tailored to reduce the likelihood of plating. One of these is the magnitude of the current pulse (or pulses) immediately before the constant voltage portion of the charging process.

Generally, smaller magnitude pulses immediately before the constant voltage portion reduce the likelihood of metal plating. In certain embodiments, the magnitude of the last constant current pulse is no greater than about 30% to about 70% the magnitude of the first constant current pulse. In some cases, the magnitude of the last constant current pulse is no greater than about a 0.5 to about a 0.7 times the C-rate. In some cases, the magnitude of the last current pulse is dependent on a measured battery temperature. Low temperatures exhibit metal plating at lower charge rates than high temperatures. The ranges above are appropriate for at least room temperature. As indicated, some charging processes are designed to avoid regions determined to cause plating or increase its likelihood. As an example, if plating was found to occur during a previous charging cycle that employed a final current pulse having a magnitude of X Amps, then the next charging cycle may be adjusted to apply a final current pulse of about 0.9X Amps or less. After such adjustment, the plating may be evaluated in the next cycle, and, if needed, the current will be further adjusted.

FIGS. 9a-b depict a type of charging process that may be used to mitigate metal plating while charging a battery. FIG. 9a shows a current versus time waveform that is applied to a battery, and FIG. 9b depicts the corresponding terminal voltage of the battery as a function of time. The charging process has a current pulse portion 902 followed by a constant voltage portion 904. In the depicted example, pulses 906, vary in magnitude and duration. As discussed elsewhere, the magnitude, shape, and duration of each current pulse is determined by the battery control logic. In various processes, the magnitude of one or more current pulses later in portion 902 is smaller than pulses earlier in the portion. The current pulses generally increase the terminal voltage of the battery as seen in FIG. 902. In some cases, voltage fluctuations that occur between current pulses, as depicted in FIG. 9b, occur because of a rest period between the pulses. As dictated by a charging process algorithm, the battery control logic initiates a constant voltage portion when the current pulse portion ends. By entering a constant voltage charging mode, the current applied to the battery tends to asymptotically decrease as the battery fully charges. By choosing the current pulses and the constant voltage to address potential plating, the charging can be conducted without reaching a terminal voltage that triggers lithium plating.

FIG. 10 depicts an example of a current and voltage waveform applied during the constant current portion of the charging process. If the battery control logic determines during a charge pulse 1002 that plating has occurred, or that battery conditions associated with plating are present, the charge pulse may be terminated at the time of the determination 1004. In some cases, if the charge pulse is short in duration, or it is determined that significant plating will not result from completing the current charge pulse, the charging circuitry may complete the charge pulse before adapting the charge process. After making the determination of plating or plating conditions at time 1004 the battery may enter a rest period or the control circuitry may initiate a discharge pulse from the battery (not depicted). If the battery control logic determines that charging can continue under the constant current pulse mode, then subsequent charge pulses 1006 may be initiated having an adjusted magnitude, duration, and/or shape.

FIG. 11 is a flowchart depicting one example of a process 1100 that reduces, prevents, or mitigates metal plating while charging a rechargeable battery. Upon initiating a charge process, charging circuitry charges the battery as indicated at 1102 in accordance with a defined charge process. For example, a battery may initially be charged in accordance with charge parameters that are based on a battery type and a manufacturer's recommended charge settings. In some cases, initial charge parameters are based on charge parameters that were determined by the battery control logic in a previous charge cycle; for example, the charge parameters may be determined using an adaptive charging process that considers CPV, relaxation time, overpotential, and/or other indicator of battery condition. In some cases, the charge parameters are set to implement a constant-current constant-voltage (CCCV) charge process, a Multi-CCCV charge process, a step charge process, or another commonly used charging method.

During the charge process, monitoring circuitry may then be used to monitor one or more battery parameters (1104) such as a battery's terminal voltage, the current applied to charge a battery, and/or the battery's temperature. Operation 1104 may be performed at periodic intervals (e.g., at discrete time intervals or discrete SOC intervals) or continually throughout the charging process. Battery control logic analyzes the monitored parameters to determine if plating, or if conditions associated with plating, has been detected as indicated at 1106. The analysis and determination performed at 1106 may be implemented using, e.g., any of the various techniques described above in the Detection of Metal Plating section. For example, when making the determination of whether metal has been plated, the battery control logic compares one or more monitored parameters to one or more expected parameters generated by a battery model. Assuming that no plating is detected, the process determines whether the charging process is completed (e.g., whether the battery has reached a defined state of charge, voltage, or amount of charge passed). See decision operation 1110. If charging is not complete, process control reverts to operation 1102, where charging continues to completion, albeit with possible additional monitoring and analyzing operations as described.

If the battery control logic determines that monitored battery parameters indicate that metal plating has occurred (as determined by, for example, comparing the monitored battery parameters to the expected battery parameters), then the battery control logic adapts one or more characteristics of the charge process as illustrated at 1108. Such adapting may be accomplished using, for example, any one or more of the techniques described in the Metal Plating Mitigation through Adaptive Charging section. For example, subsequent current pulses may be applied with a lower magnitude current, with one or more discharge pulses, and/or with a rest period between pulses. Alternatively, or in addition, a prescribed applied voltage may be reduced, and/or the battery's temperature may be increased. In some cases, if plating is detected, the battery process is terminated as indicated at optional process path 1112, even if the battery has not been fully charged.

After adapting or adjusting the charge process (or after determining that plating has not been detected in operation 1106), the battery control logic determines whether the battery charge process is completed 1110 (e.g., by determining whether the battery has reached a target charge capacity). If the charge process has not been completed and plating was detected in operation 1106, the process returns to charging the battery, but using an adapted or adjusted charge process, as specified at 1108, designed to mitigate plating as specified.

Once a determination is made by the battery control logic that battery is fully charged (e.g., the battery has reached its target charge capacity), the charging process is terminated. While not depicted, process 1100 may incorporate other adaptive charging methods referenced herein. For example, monitoring circuitry may measure a charge pulse voltage (CPV) and/or a relaxation time in operation 1104, and battery control logic may adapt or adjust one or more characteristics of the charge process based on the measured CPV and/or relaxation time.

While methods of mitigating metal plating are primarily discussed in relation to a CCCV charge process, these methods may also be applied to prevent or reduce metal plating in other charge process. One variation of CCCV charging, known as a Multi-CCCV charging, includes multiple constant current and constant voltage stages. As an illustrative example, a Multi-CCCV charge process may follow the pattern illustrated by the following charge process. First, a battery is charged at a constant current (e.g., 1 A) until a first terminal threshold voltage is reached (e.g., 3.9 V). Next, the battery is charged at constant voltage (e.g., at the first terminal threshold voltage) until a first current threshold is reached (e.g., 0.5 A). After reaching the first current threshold, the process returns to a step where the battery is again charged at a constant current (e.g., at a current equivalent to the first current threshold) until a second voltage threshold is reached (e.g., 4.1 V). The charge process then returns to a constant voltage charging step (e.g., at the second voltage threshold) until a second current threshold is reached, and the process continues this pattern of alternating between CC and CV charging steps until the battery is fully charged or the charging process is terminated. Another charge process that by easily be adapted to incorporated methods described herein is a step charge process. A step charge process includes a series of constant current charging steps wherein a lower current is applied to the battery in each consecutive step and steps are terminated when a threshold voltage is reached. For example, a battery may be charged at 1 A until a voltage of 3.9 V is reached, then 0.5 A until a voltage of 4.1 V is reached, and so on. One of skill in the art may easily see how methods described herein be used to transform these charge processes into adaptive charge processes that mitigate metal plating.

Apparatus

The battery charging system may have many configurations. In some cases, all or most of the measured battery parameter values (e.g., current, voltage, and temperature) are collected by a single module or circuit, while in other cases, the parameter values are collected by multiple modules and/or circuits. Battery monitoring circuits and/or charging circuits may be used for this purpose. In some cases, the battery control logic, whether operating alone or in conjunction with battery monitoring and/or charging circuitry, may be used to collect the parameter values. In certain embodiments, the parameter values are collected by a module, circuit, or logic that is directly connected to a battery such as a circuit or a module that is physically attached to, mounted on, or encased in an electronic device housing the battery. In other embodiments, the parameter values are collected by a module, circuit, or logic that is distant from the battery and/or the electronic device powered by the battery. For example, the module, circuit, or logic may be coupled to the battery and/or device by a wired or wireless link.

The apparatus that operates the battery control logic may be the same apparatus used to collect the battery parameter values or may be a distinct apparatus such as a mobile device, a server, or a distributed collection of remote processing devices. In some implementations, a cloud-based application is used to store and operate the battery control logic. In certain embodiments, the apparatus used to collect battery use parameters is also used to adaptively charge a battery.

FIG. 1 depicts in block form a battery monitoring/charging system that may be configured to prevent or reduce metal plating by adaptively charging a battery. The apparatus includes charging circuitry 112 that responds to control signals to generate a charge signal that is applied to the terminals of the battery. The apparatus also includes measurement circuitry 114 coupled to the battery, to measure voltage, current, and/or other battery parameter values that may be used for adaptive charging. Control circuitry 116 is coupled to the charging circuitry and the measuring circuitry. Using data received by the monitoring circuitry the control circuitry is configured to generate one or more control signals to adapt one or more characteristics of a charge packet in the context of adaptive charging. In some cases, the control circuitry may also play roles in monitoring battery performance and collecting battery parameter values.

Charge Circuitry

In one embodiment, charging circuitry 112 applies one or more charge signals to the battery in response to control circuitry. The charge signals applied by the charging circuitry may include one or more charging signals which provide a net input of charge or current into the battery (see, for example, FIGS. 3*a* and 3*b*) and one or more discharging signals which provide a net removal of charge or current from the battery (see, for example, FIGS. 3*c* and 3*d*).

The adaptive charging circuitry and techniques may employ any charging circuitry, whether described herein, now known or later developed, to charge the battery; all such charging circuitry are intended to fall within the scope of this disclosure. For example, charging circuitry may generate charge and discharge signals, packets, and pulses (as described herein). Notably, charging circuitry is generally responsive to control signals from the control circuitry.

With reference to FIGS. 4*a*-4*j*, the charge and discharge signals may include a plurality of charge packets where each charge packet includes one or more charge pulses and, in certain embodiments, one or more discharge pulses. The charge and discharge signals may also include one or more discharge packets wherein each discharge charge packet includes one or more discharge pulses. (See, e.g., FIGS. 4*k*-4*n*). Indeed, the charge and discharge signals may also include charge packets and one or more discharge packets wherein each charge packet and discharge packet include one or more charge pulses and/or one or more discharge pulses. (See, e.g., FIGS. 4*k* and 4*n*).

Discharge signals remove charge from the battery and may be employed to reduce the time period for the battery terminal voltage to return to equilibrium. In this regard, the discharge period may remove excess charge that might otherwise contribute to degradation mechanisms such as the thickening of the solid-electrolyte interface (SEI) layer or metallic plating of lithium. Clearly, the difference between the electrical charge added to the cell during a charging period and the electrical charge removed from the cell during a discharge period determines a net total electrical charge added to the cell in one period. This net total electrical charge divided by the period may determine a net effective charging current. All combination or permutations of charge signals are provided by the charge circuitry and are intended to fall within the scope of the present disclosure.

Monitoring Circuitry

Monitoring circuitry 114 measures, monitors, senses, detects and/or samples, on a continuous or periodic basis (e.g., at predetermined states of charged) one or more conditions or characteristics of the battery. For example, the monitoring circuitry may measure the terminal voltage (an open circuit voltage (OCV) or a closed circuit voltage (CCV)), the voltage response of the battery to one or more charge pulses, and/or temperature of the battery. In one embodiment, the monitoring circuitry includes a sensor to determine a voltage (for example, a voltmeter) and/or a sensor to determine a current (for example, a current meter). The monitoring circuitry provides data which is representative of the condition or characteristics of the battery to the control circuitry. Moreover, the monitoring circuitry may include one or more temperature sensors which are thermally coupled to the battery to generate, measure, and/or provide data which is representative of the temperature of the battery. The monitoring circuitry and techniques may be those described herein, now known or later developed, to acquire data employed by the control circuitry to adapt the charging profile of the battery; all such monitoring circuitry and techniques are intended to fall within the scope of this disclosure.

Control Circuitry

In certain embodiments, the control circuitry 116, using data from monitoring circuitry, calculates, determines and/or assesses the state or condition of the battery in connection with the charging or recharging process. For example, control circuitry may calculate, determine and/or estimate a change in terminal voltage of the battery in response to charge or current applied to or injected into the battery. In some cases, the control circuitry may determine that metal plating that has occurred on the electrodes of a battery, and in some cases, the control circuitry may estimate or calculate the amount of plating that has occurred. The control circuitry may also calculate, determine and/or estimate one, some, or all of the SOC of the battery, SOH of the battery, partial relaxation time of the battery and/or overpotential or full relaxation time of the battery.

The control circuitry may also calculate, determine, and/or implement a charging sequence or charging profile based on or using one or more of the adaptive charging techniques and algorithms. For example, the control circuitry may be configured to implement any of the charge or discharge adjustments described herein to address plating or potential plating. In this regard, control circuitry adapts, adjusts and/or controls one or more characteristics of the charge or current applied to or injected into the battery (via controlling the operation of charging circuitry) so that the terminal voltage, the change in terminal voltage, or another battery parameter (in response to charge or current applied to or injected into the battery during a charging or recharging sequence/operation) is within a predetermined range and/or below a predetermined value. In this regard, one or more characteristics of the charge signal may be adapted to control and/or manage battery parameters such as the terminal voltage, or a relaxation time. In addition to adapting the sequence of charge signals, discharge signals and rest periods—in relation to each other—the control circuitry may vary, adjust and/or control one or more of the variable characteristics of a charge signal. In some cases, the control circuitry may configured to obtain or provide a desired or predetermined relaxation time or period (for example, a relaxation time that is within prescribed range), by adjusting and/or controlling the amount of electrical charge removed during a discharge period, the amount of electrical charge added during a charge period, and/or the characteristics of a rest period. In one embodiment, the adaptive charging technique or algorithm employs a sequence of discharge signals where the relaxation time is calculated, determined and/or measured after each of the discharge signals. In this way, the control circuitry may adaptively determine the total amount of electrical charge that should be removed (and, in response thereto, control the charging circuitry accordingly).

There are numerous permutations involving the amount of electrical charge added to the battery during the charge signal and the amount of charge removed during the discharge signal. All permutations are intended to fall within the scope of the present disclosure. Notably, each permutation may result in a different relaxation period. Moreover, within each permutation, there exists a large number of sub-permutations that i) combine the characteristics of a charge signals (for example, the duration, shape and/or amplitude of the charge signal), the product of which determines the amount of electrical charge added to the cell; and ii) combine the characteristics of a discharge signal (for example, the duration, shape and/or amplitude of a discharge signal), the product of which determines the amount of electrical charge removed from the cell; and iii) the length of time of the rest period. The characteristics of a charge signals may differ from the characteristics of a discharge signals. That is, one or more of the duration, shape and/or amplitude of the charge signal may differ from one or more of the duration, shape and/or amplitude of the discharge signal.

Notably, control circuitry may include one or more processors, one or more state machines, one or more gate arrays, programmable gate arrays and/or field programmable gate arrays, and/or a combination thereof. Indeed, control circuitry and monitoring circuitry may share circuitry with each other as well as with other elements; such circuitry may be distributed among a plurality of integrated circuits which may also perform one or more other operations, which may be separate and distinct from that described herein. In some embodiments, control circuitry may be housed within a device containing the battery. Alternatively, a battery may be housed in an electronic device, while control circuitry may be housed elsewhere. For example, control circuitry may operate on a remote server or a cloud-based application. In some cases, control circuitry may be coupled to monitoring circuitry and/or charging circuitry via wireless or wired communication. In some cases, control circuitry may be configured to store identified parameter values on a remote server, and in some cases, control circuitry algorithms may be updated by a user.

Control circuitry may perform or execute one or more applications, routines, programs and/or data structures that implement particular methods, techniques, tasks or operations described and illustrated herein. The functionality of the applications, routines or programs may be combined or distributed. In addition, the applications, routines or programs may be implementing by control circuitry using any programming language whether now known or later developed, including, for example, assembly, FORTRAN, C, C++, and BASIC, whether compiled or uncompiled code; all of which are intended to fall within the scope of the present disclosure.

What is claimed is:

1. A method of controlling a charging process of a rechargeable battery, the method comprising:
    charging the rechargeable battery using a first charging process;
    determining that metal is likely to deposit on a negative electrode of the rechargeable battery during the first charging process at a particular state of charge (SOC) or a particular range of SOC;

responsive to determining that the metal is likely to deposit on the negative electrode of the rechargeable battery at the particular SOC, adjusting the first charging process to produce a second charging process applicable with respect to the particular SOC or the particular range of SOC; and charging the rechargeable battery using the second charging process, wherein charging the rechargeable battery using the second charging process mitigates plating at the particular SOC or the particular range of SOC.

2. The method of claim 1, wherein the second charging process is in a different charging cycle of the rechargeable battery than the first charging process.

3. The method of claim 1, wherein the determination that the metal is likely to deposit on the negative electrode is based at least in part on a model of the rechargeable battery.

4. The method of claim 3, wherein the model is selected from a plurality of models based at least in part on the model being relevant to the particular SOC or the particular range of SOC.

5. The method of claim 4, wherein the plurality of models comprises at least one model relevant to a lower SOC, and at least one model relevant to a higher SOC.

6. The method of claim 1, wherein the second charging process further comprises reducing a charging voltage during a constant voltage portion of the second charging process relative to a charging voltage utilized during a constant voltage portion of the first charging process.

7. The method of claim 1, wherein the second charging process further comprises increasing a temperature of the battery.

8. The method of claim 1, wherein the second charging process comprises a reduced current at the particular SOC and/or the particular SOC range.

9. An apparatus for controlling a charging process of a rechargeable battery, comprising:
monitoring and control circuitry, coupled to the rechargeable battery, configured to:
charge the rechargeable battery using a first charging process;
determine that metal is likely to deposit on a negative electrode of the rechargeable battery during the first charging process at a particular state of charge (SOC) or a particular range of SOC;
responsive to determining that the metal is likely to deposit on the negative electrode of the rechargeable battery at the particular SOC, adjust the first charging process to produce a second charging process applicable with respect to the particular SOC or the particular range of SOC; and
charge the rechargeable battery using the second charging process, wherein charging the rechargeable battery using the second charging process mitigates plating at the particular SOC or the particular range of SOC.

10. The apparatus of claim 9, wherein the second charging process is in a different charging cycle of the rechargeable battery than the first charging process.

11. The apparatus of claim 9, wherein the determination that the metal is likely to deposit on the negative electrode is based at least in part on a model of the rechargeable battery.

12. The apparatus of claim 11, wherein the model is selected from a plurality of models based at least in part on the model being relevant to the particular SOC or the particular range of SOC.

13. The apparatus of claim 12, wherein the plurality of models comprises at least one model relevant to a lower SOC, and at least one model relevant to a higher SOC.

14. The apparatus of claim 9, wherein the second charging process further comprises reducing a charging voltage during a constant voltage portion of the second charging process relative to a charging voltage utilized during a constant voltage portion of the first charging process.

15. The apparatus of claim 9, wherein the second charging process further comprises increasing a temperature of the battery.

16. The apparatus of claim 9, wherein the second charging process comprises a reduced current at the particular SOC and/or the particular SOC range.

* * * * *